(12) United States Patent
Oggier et al.

(10) Patent No.: US 8,928,503 B2
(45) Date of Patent: Jan. 6, 2015

(54) DATA ENCODING METHODS, DATA DECODING METHODS, DATA RECONSTRUCTION METHODS, DATA ENCODING DEVICES, DATA DECODING DEVICES, AND DATA RECONSTRUCTION DEVICES

(75) Inventors: Frederique Oggier, Singapore (SG); Anwitaman Datta, Singapore (SG)

(73) Assignee: Nanyang Technological University, Singapore (SG)

( * ) Notice: Subject to any disclaimer, the term of this patent is extended or adjusted under 35 U.S.C. 154(b) by 41 days.

(21) Appl. No.: 13/809,823

(22) PCT Filed: Dec. 8, 2010

(86) PCT No.: PCT/SG2010/000457
§ 371 (c)(1),
(2), (4) Date: Apr. 11, 2013

(87) PCT Pub. No.: WO2012/008921
PCT Pub. Date: Jan. 19, 2012

(65) Prior Publication Data
US 2014/0152476 A1    Jun. 5, 2014

Related U.S. Application Data

(60) Provisional application No. 61/364,082, filed on Jul. 14, 2010.

(51) Int. Cl.
*H03M 13/00* (2006.01)
*H03M 13/47* (2006.01)
*H03M 13/37* (2006.01)
*H03M 13/15* (2006.01)

(52) U.S. Cl.
CPC ............ *H03M 13/47* (2013.01); *H03M 13/373* (2013.01); *H03M 13/3761* (2013.01); *H03M 13/1515* (2013.01)
USPC ................................................ 341/94; 341/51

(58) Field of Classification Search
CPC ..................... H03M 13/1545; H03M 13/1515; H03M 13/136; G06F 7/544; H04L 9/08
USPC .......................... 341/94, 50, 51; 714/784, 782
See application file for complete search history.

(56) References Cited

U.S. PATENT DOCUMENTS 5,768,438 A *  6/1998  Etoh .............................. 382/251
6,178,536 B1    1/2001  Sorkin (Continued)

OTHER PUBLICATIONS

Bhagwan, R., et al.; "Total Recall: System Support for Automated Availability Management;" Proceedings of the 1$^{st}$ ACM/USENIX Symposium on Networked Systems and Design and Implementation; dated Mar. 2004.

(Continued)

*Primary Examiner* — Peguy Jean Pierre
(74) *Attorney, Agent, or Firm* — Alston & Bird LLP

(57) ABSTRACT

In an embodiment, a data encoding method may be provided. The data encoding method may include: inputting data to be encoded; determining a polynomial so that an evaluation of the polynomial at a sum of a first supporting point of the polynomial and a second supporting point of the polynomial corresponds to the sum of an evaluation of the polynomial at the first supporting point and an evaluation of the polynomial at the second supporting point, wherein coefficients of the polynomial are determined based on the data to be encoded; and generating a plurality of encoded data items by evaluating the polynomial at a plurality of supporting points.

30 Claims, 11 Drawing Sheets

(56) References Cited

U.S. PATENT DOCUMENTS

| | | | |
|---|---|---|---|
| 6,279,137 B1* | 8/2001 | Poeppelman et al. | 714/781 |
| 6,631,172 B1 | 10/2003 | Shokrollahi et al. | |
| 6,877,128 B2 | 4/2005 | Boyer et al. | |
| 6,930,809 B1* | 8/2005 | Kagawa et al. | 358/518 |
| 8,108,759 B2* | 1/2012 | Moon et al. | 714/781 |
| 8,332,446 B1* | 12/2012 | Everest | 708/203 |
| 8,392,086 B2* | 3/2013 | Taniguchi et al. | 701/70 |
| 8,621,330 B2* | 12/2013 | Yekhanin et al. | 714/781 |
| 2003/0126549 A1* | 7/2003 | Seki | 714/786 |
| 2004/0059989 A1 | 3/2004 | Fredrickson et al. | |
| 2010/0174969 A1 | 7/2010 | Ashe et al. | |

OTHER PUBLICATIONS

"Configurations: Easy Configurable;" Cleversafe; retrieved on Aug. 31, 2010 from <http://www.cleversafe.org/dispersed-storage/configurations>.

Datta, A., et al.; "Internet-scale storage systems under churn—A steady state analysis;" LSIR-Report-2005-002; dated 2005.

Dimakis, A. G., et al.; "Network Coding for Distributed Storage Systems;" IEEE Transaction on Information Theory, vol. 56, No. 9; dated Sep. 2010.

Dimakis, A. G., et al.; "Network Coding for Distributed Storage Systems;" retrieved from <http://www.cs.uiuc.edu/homes/pbg/papers/coding-journal.pdf>.

Dimakis, A. G., et al.; "The Benefits of Network Coding for Peer-to-Peer Storage Systems".

Duminuco, A., et al.; "A Practical Study of Regenerating Codes for Peer-to-Peer Backup Systems;" ICDCS '09 Proceedings of the 2009 $29^{th}$ IEEE International Conference on Distributed Computing Systems; dated 2009.

Duminuco, A., et al.; "Hierarchical Codes: How to Make Erasure Codes Attractive for Peer-to-Peer Storage Systems;" $8^{th}$ International Conference on Peer-to-Peer Computing, P2P '08; dated Sep. 2008.

International Search Report for Application No. PCT/SG2010/000457; dated Feb. 1, 2011.

Liu, X., et al.; "Redundancy Maintenance and Garbage Collection Strategies in Peer-to-Peer Storage Systems;".

Plank, J. S.; "T1: Erasure Codes for Storage Applications;" Tutorial, Fast-2005: $4^{th}$ Usenix Conference on File and Storage Technologies ; dated Dec. 2005.

Rashmi, K. V., et al.; "Explicit Construction of Optimal Exact Regenerating Codes for Distributed Storage;" arXiv:0906.4913v2[cs.IT]; dated Oct. 2009.

Reed, I. S., et al.; "Polynomial Codes Over Certain Finite Fields;" Journal of the Society for Industrial and Appl. Mathematics, vol. 8, No. 2; dated 1960.

Rodrigues, R., et al.; "High Availability in DHTs: Erasure Coding vs. Replication;" Peer-to-Peer Systems IV $4^{th}$ International Workshop; dated Feb. 2005.

* cited by examiner

DATA ENCODING METHODS, DATA DECODING METHODS, DATA RECONSTRUCTION METHODS, DATA ENCODING DEVICES, DATA DECODING DEVICES, AND DATA RECONSTRUCTION DEVICES

TECHNICAL FIELD

Embodiments relate to data encoding methods, data decoding methods, data reconstruction methods, data encoding devices, data decoding devices, and data reconstruction devices.

BACKGROUND

Erasure codes may provide a storage efficient alternative to replication based redundancy in (networked) storage systems. They however may entail high communication overhead for maintenance, when some of the encoded fragments are lost and need to be replenished. Such overheads may arise from the fundamental need to recreate (or keep separately) first a copy of the whole object before any individual encoded fragment can be generated and replenished.

Therefore, there is a need for a way to generate and replenish any individual encoded fragment without having to acquire first a copy of the whole object.

SUMMARY

In various embodiments, a data encoding method may be provided. The data encoding method may include: inputting data to be encoded; determining a polynomial so that an evaluation of the polynomial at a sum of a first supporting point of the polynomial and a second supporting point of the polynomial corresponds to the sum of an evaluation of the polynomial at the first supporting point and an evaluation of the polynomial at the second supporting point, wherein coefficients of the polynomial are determined based on the data to be encoded; and generating a plurality of encoded data items by evaluating the polynomial at a plurality of supporting points.

In various embodiments, a data decoding method may be provided. The data decoding method may include: inputting a plurality of encoded data items; determining a polynomial that corresponds to the encoded data items based on a pre-defined similarity criterion so that an evaluation of the polynomial at a sum of a first supporting point of the polynomial and a second supporting point of the polynomial corresponds to the sum of an evaluation of the polynomial at the first supporting point and an evaluation of the polynomial at the second supporting point; determining coefficients of the polynomial; and generating decoded data based on the coefficients.

In various embodiments, a data reconstruction method may be provided. The data reconstruction method may include: determining, for an encoded data item that is to be reconstructed, at least two other encoded data items based on a pre-determined polynomial for which an evaluation of the polynomial at a sum of a first supporting point of the polynomial and a second supporting point of the polynomial corresponds to the sum of an evaluation of the polynomial at the first supporting point and an evaluation of the polynomial at the second supporting point; and reconstructing the encoded data item that is to be reconstructed, based on the determined at least two other encoded data items.

In various embodiments, a data encoding device may be provided. The data encoding device may include: an input circuit configured to input data to be encoded; a polynomial determining circuit configured to determine a polynomial so that an evaluation of the polynomial at a sum of a first supporting point of the polynomial and a second supporting point of the polynomial corresponds to the sum of an evaluation of the polynomial at the first supporting point and an evaluation of the polynomial at the second supporting point, wherein the coefficients of the polynomial are determined based on the data to be encoded; and a generating circuit configured to generate a plurality of encoded data items by evaluating the polynomial at a plurality of supporting points.

In various embodiments, a data decoding device may be provided. The data decoding device may include: an input circuit configured to input a plurality of encoded data items; a polynomial determining circuit configured to determine a polynomial that corresponds to the encoded data items based on a pre-defined similarity criterion so that an evaluation of the polynomial at a sum of a first supporting point of the polynomial and a second supporting point of the polynomial corresponds to the sum of an evaluation of the polynomial at the first supporting point and an evaluation of the polynomial at the second supporting point; a coefficients determining circuit configured to determine coefficients of the polynomial; and a decoded data generating circuit configured to generate decoded data based on the coefficients.

In various embodiments, a data reconstruction device may be provided. The data reconstruction device may include: an encoded data determining circuit configured to determine, for an encoded data item that is to be reconstructed, at least two other encoded data items based on a pre-determined polynomial for which an evaluation of the polynomial at a sum of a first supporting point of the polynomial and a second supporting point of the polynomial corresponds to the sum of an evaluation of the polynomial at the first supporting point and an evaluation of the polynomial at the second supporting point; and a reconstructing circuit configured to reconstruct the encoded data item that is to be reconstructed, based on the determined at least two other encoded data items.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments of the invention are described with reference to the following drawings, in which.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

The data encoding device may include a memory which is for example used in the processing carried out by data encoding device. The data decoding device may include a memory which is for example used in the processing carried out by data decoding device. The data reconstruction device may include a memory which is for example used in the processing carried out by data reconstruction device. A memory used in the embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory).

In an embodiment, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment.

The word "exemplary" is used herein to mean "serving as an example, instance, or illustration". Any embodiment or design described herein as "exemplary" is not necessarily to be construed as preferred or advantageous over other embodiments or designs.

In various embodiments, the terms 'fragment' and 'block' may be used interchangeably. Depending on the context, the term 'data' may be used to mean either fragment(s) or object(s).

Figure 1:
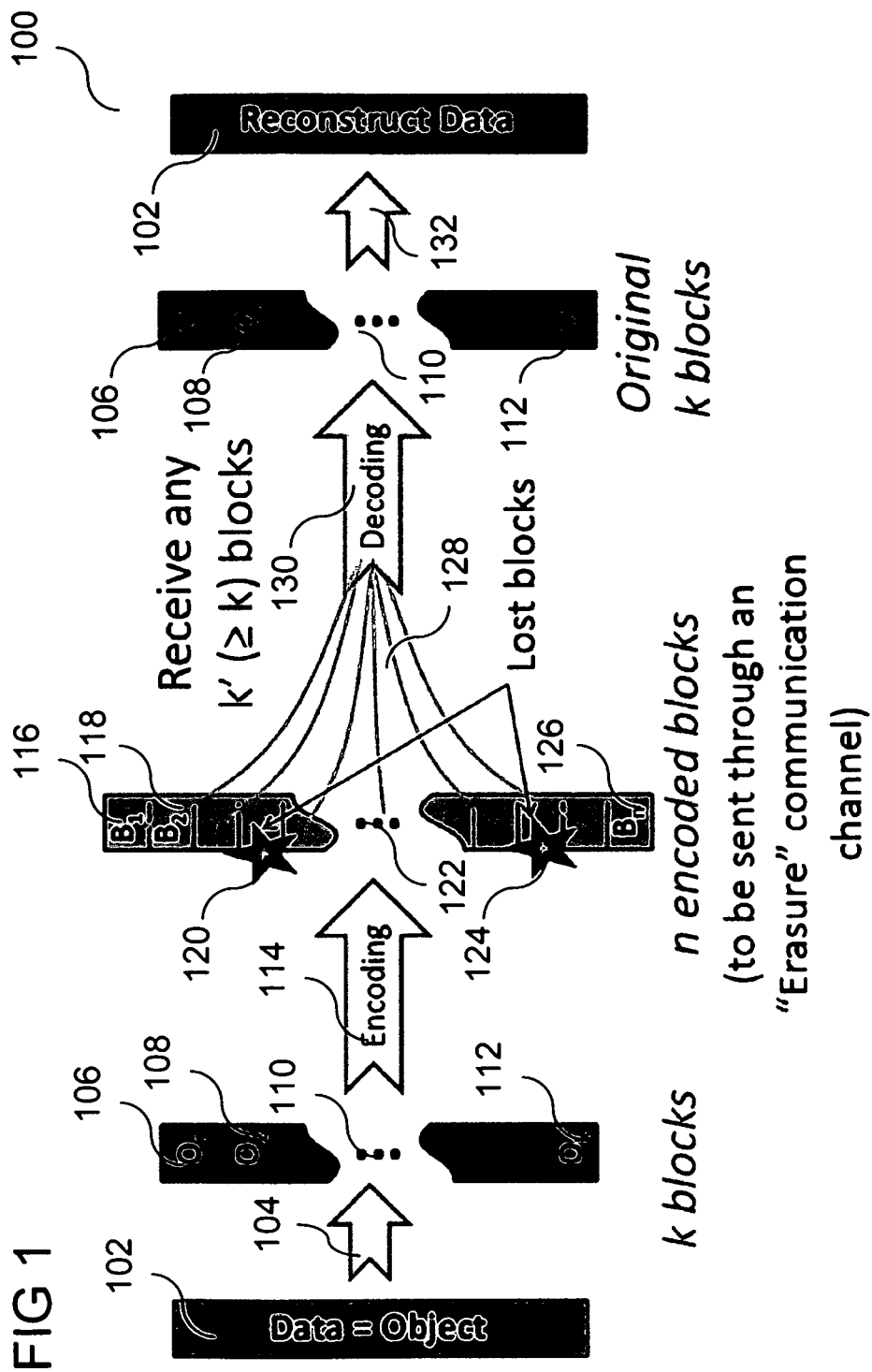
FIG. 1 shows an illustration of erasure codes for communication in accordance with an embodiment.

FIG. 1 shows an illustration 100 of erasure codes (EC) for communication in accordance with an embodiment. In the illustration 100, the way erasure codes are used for communication channels is illustrated. A message 102 to be sent over a noisy channel may be split (like indicated by arrow 104) into k blocks (wherein k may be a positive integer; for example a first data block 106, a second data block 108, further data blocks 110, and a k-th data block 112), which may be encoded (like indicated by arrow 114) into n (wherein n may be larger than k) blocks (for example a first encoded block 116, a second encoded block 118, further encoded blocks 122, and an n-th encoded block 126), thus introducing redundancy. The communication channel may erase some of the encoded blocks (for example a first erased block 120, and a second erased block 124, like indicated by stars in FIG. 1), but by the code property, the original message may be recovered (like indicated by an arrow 130 for decoding and an arrow 132 for de-blocking) out of any k received encoded blocks 128.

Figure 2:
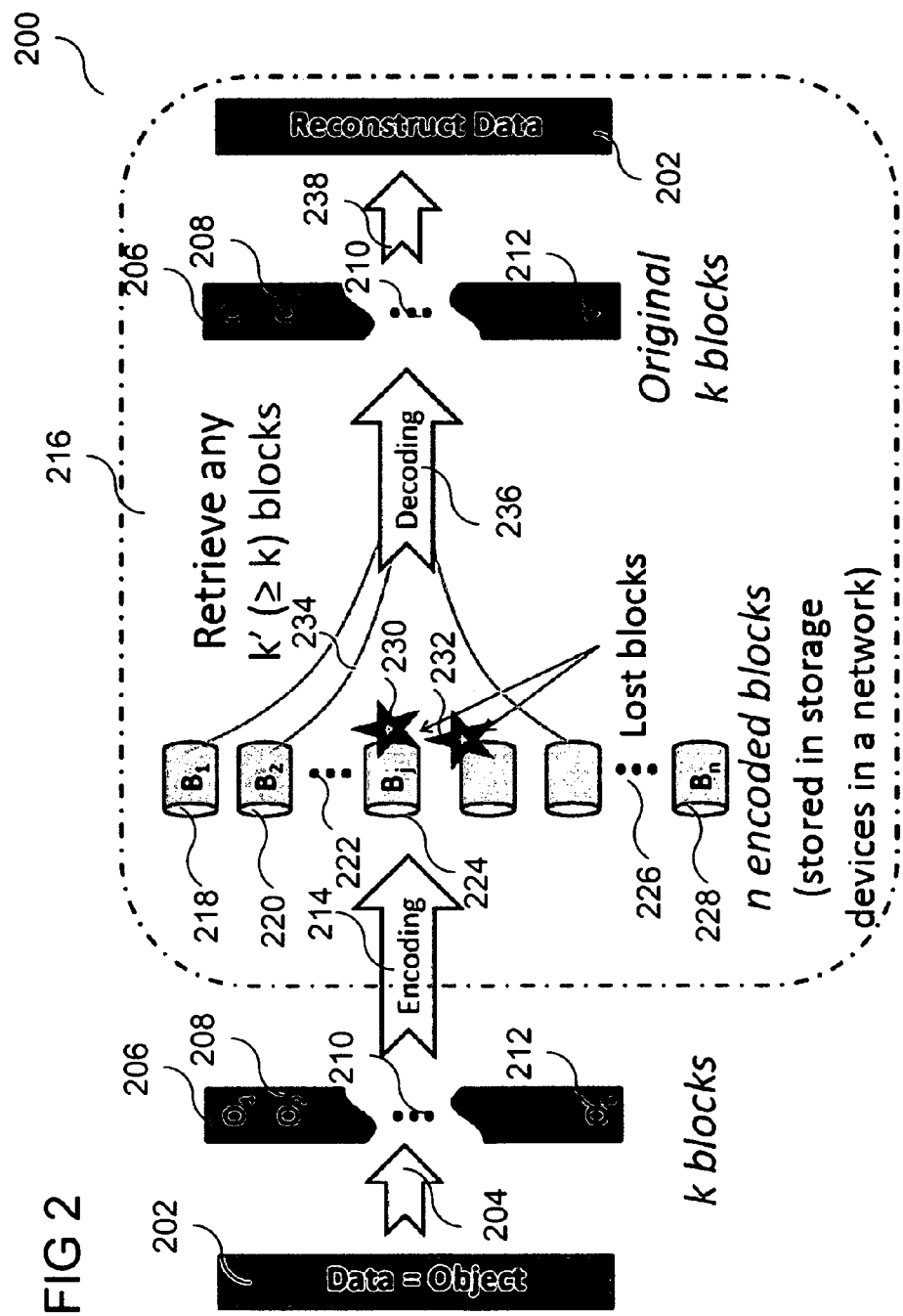
FIG. 2 shows an illustration of erasure codes for networked storage in accordance with an embodiment.

FIG. 2 shows an illustration 200 of erasure codes for networked storage in accordance with an embodiment. In the illustration 200, it is illustrated how erasure codes may be used for usage in networked storage. Data 202 as an object for storing may be divided (like indicated by arrow 204) into k blocks (wherein k may be a positive integer; for example a first data block 206, a second data block 208, further data blocks 210, and a k-th data block 212). The k blocks may be encoded, like indicated by arrow 214 into n (wherein n may be larger than k) encoded blocks, for example a first encoded block 218, a second encoded block 220, further encoded blocks 222, an j-th encoded block 224 (wherein j may be an integer smaller than or equal to n), still further encoded blocks 226, and an n-th encoded block 228. The n encoded blocks may be stored in n devices in the network 216. If up to n−k such devices fail (for example a device storing the j-th encoded block 224 (like indicated by a first star 230) and another device storing another encoded block (like indicated by a second star 232)), it may still be possible to recover (like indicated by an arrow 236 for decoding and an arrow 238 for de-blocking) the whole data 202 based on only any k available encoded blocks 234.

Figure 3:
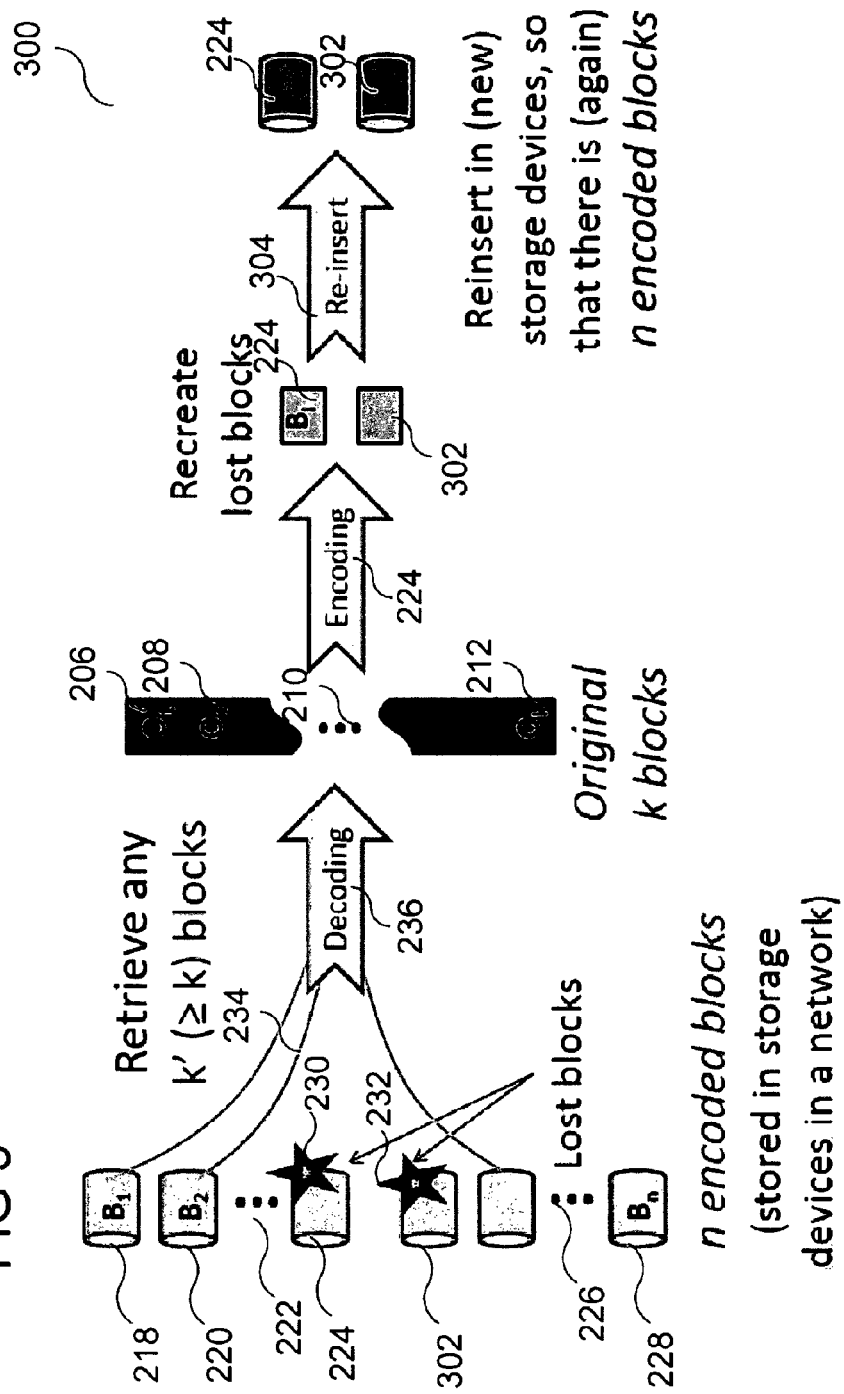
FIG. 3 shows an illustration of data reconstruction in a commonly used way.

FIG. 3 shows an illustration 300 of data reconstruction in a commonly used way using erasure codes for networked storage. Various elements of the illustration 300 may be similar to elements shown in the illustration 200 of FIG. 2, and the same reference signs may be used and duplicate description may be omitted. In the illustration 300, a maintenance process in networked storage systems is shown. If a device goes offline (for example the device storing the j-th encoded block 224, or another device storing another block 302), the block it possessed is lost, and to keep redundancy of the stored object in the network, the lost block should be restored and stored in a new node. To reconstruct it, the regular procedure is to first recreate the whole object (including downloading enough blocks to reconstruct the whole object, or do something equivalent), from which the missing block may be recreated. Alternatively, a node may need to store a complete copy of the object, so that it can recreate missing blocks. Then, the re-created blocks may be re-inserted into the devices, like indicated by arrow 304.

Figure 4:
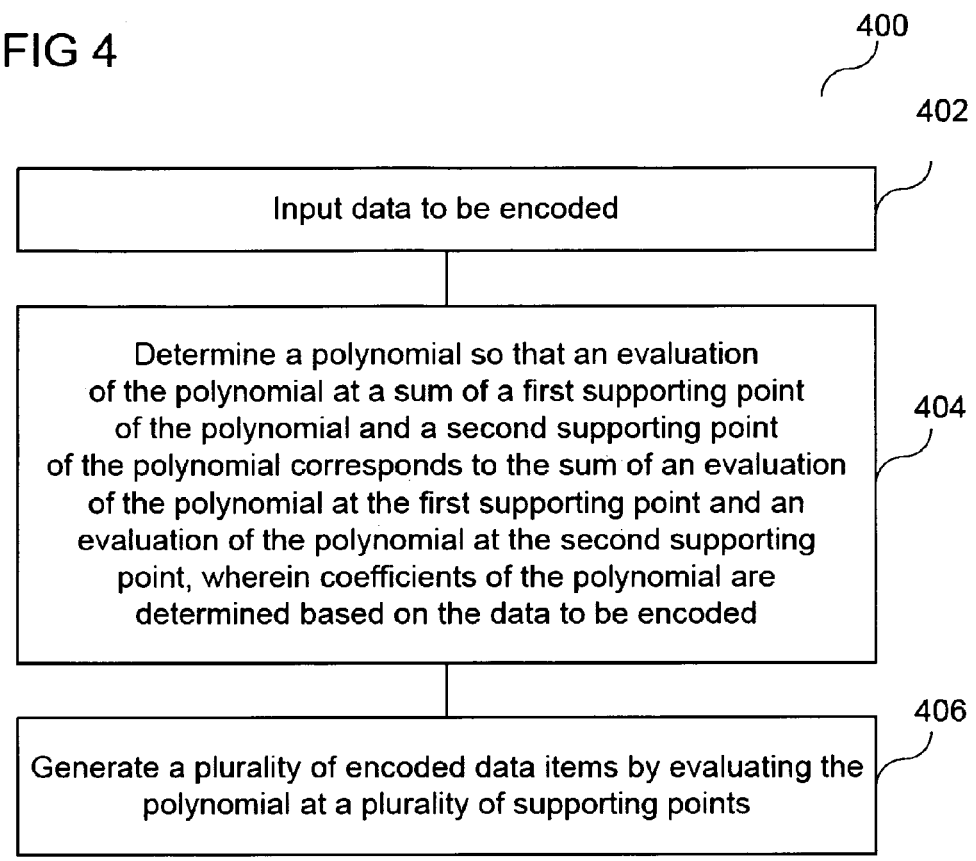
FIG. 4 shows a flow diagram illustrating a data encoding method in accordance with an embodiment.

FIG. 4 shows a flow diagram 400 illustrating a data encoding method in accordance with an embodiment. In 402, data to be encoded may be inputted. In 404, a polynomial may be determined so that an evaluation of the polynomial at a sum of a first supporting point of the polynomial and a second supporting point of the polynomial corresponds to or is equal to the sum of an evaluation of the polynomial at the first supporting point and an evaluation of the polynomial at the second supporting point, wherein coefficients of the polynomial may be determined based on the data to be encoded. In 406, a plurality of encoded data items may be generated by evaluating the polynomial at a plurality of supporting points.

According to various embodiments, a supporting point may be any arbitrary non-zero point, for which the polynomial is evaluated, and the correspondence described above holds for every supporting point.

According to various embodiments, the polynomial may further be determined so that an evaluation of the polynomial at a product of a value and a third supporting point of the polynomial corresponds to or is equal to the product of the value and an evaluation of the polynomial at the third supporting point. According to various embodiments, the value may be an element of a finite field with a number of elements corresponding to a power of two, and with a number of elements lower than the number of elements of a finite field of which the third supporting point may be an element. According to various embodiments, the third supporting point may be different from the first supporting point and the second supporting point. According to various embodiments, the third supporting point may be equal to the first supporting point or to the second supporting point.

According to various embodiments, the polynomial may be a weakly linearized polynomial, like will be explained in more detail below.

According to various embodiments, the data to be encoded may be divided into a plurality of encoding blocks.

According to various embodiments, at least one coefficient of the polynomial may correspond or may be equal to an encoding block of the plurality of encoding blocks. According to various embodiments, each coefficient of the polynomial may correspond to or may be equal to an encoding block of the plurality of encoding blocks. According to various embodiments, each block of the plurality of blocks may be used in one coefficient of the polynomial.

According to various embodiments, at least one encoding block of the plurality of encoding blocks may be or may include an element of a finite field. According to various embodiments, each encoding block of the plurality of encoding blocks may be or may include an element of the finite field.

According to various embodiments, at least one supporting point of the plurality of supporting points may be an element of a multiplicative group, wherein the multiplicative group may be the finite field without a zero element.

According to various embodiments, a generator of the multiplicative group may be determined.

According to various embodiments, the polynomial may be a polynomial p of the form $$p(X) = \sum_{i=0}^{k-1} p_i X^{2^i},$$

wherein k may be a positive integer, and $p_i$ may be an element of a finite field, for example with a number of elements corresponding to a power of 2, for every integer i between 0 and k−1.

Figure 5:
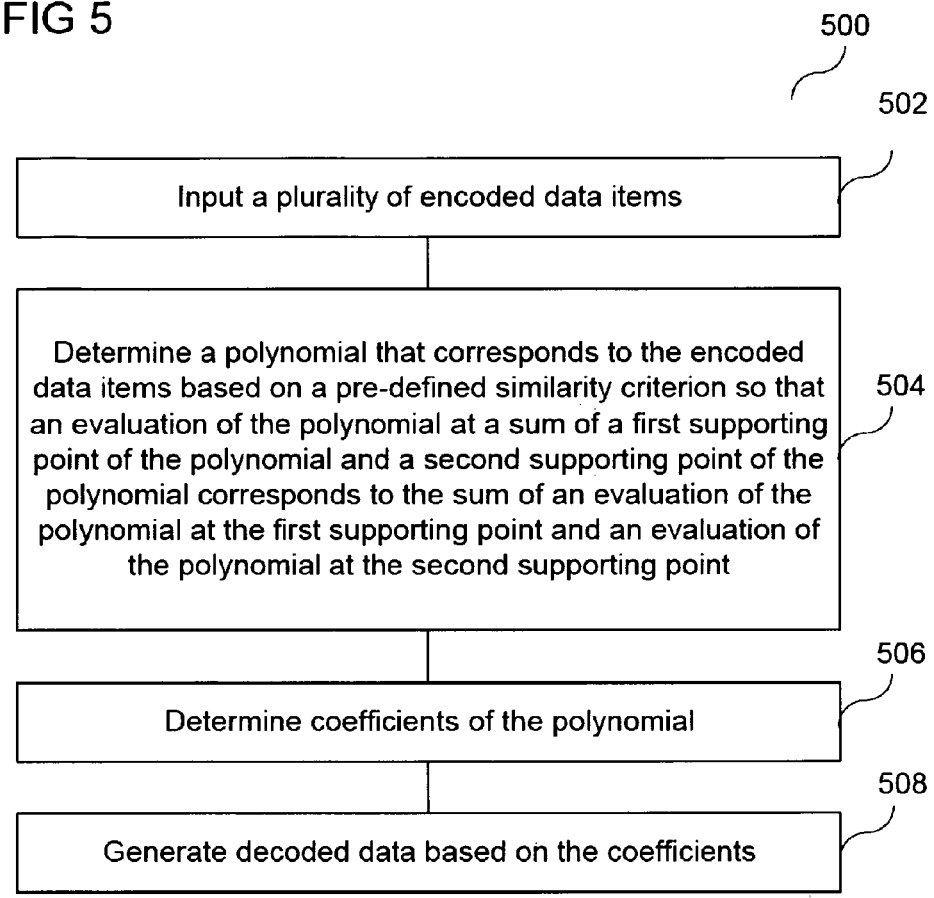
FIG. 5 shows a flow diagram illustrating a data decoding method in accordance with an embodiment.

FIG. 5 shows a flow diagram 500 illustrating a data decoding method in accordance with an embodiment. In 502, a plurality of encoded data items may be inputted. In 504, a polynomial may be determined that corresponds to the encoded data items based on a pre-defined similarity criterion so that an evaluation of the polynomial at a sum of a first supporting point of the polynomial and a second supporting point of the polynomial corresponds to or is equal to the sum of an evaluation of the polynomial at the first supporting point and an evaluation of the polynomial at the second supporting point. In 506, coefficients of the polynomial may be determined. In 508, decoded data may be generated based on the coefficients.

According to various embodiments, the polynomial may further be determined so that an evaluation of the polynomial at a product of a value and a third supporting point of the polynomial corresponds to or is equal to the product of the value and an evaluation of the polynomial at the third supporting point. According to various embodiments, the value may be an element of a finite field with a number of elements corresponding to a power of two, and with a number of elements lower than the number of elements of a finite field of which the third supporting point may be an element. According to various embodiments, the third supporting point may be different from the first supporting point and the second supporting point. According to various embodiments, the third supporting point may be equal to the first supporting point or to the second supporting point.

According to various embodiments, the polynomial may be a weakly linearized polynomial, like will be explained in more detail below.

According to various embodiments, a block of decoded data may be generated based on at least one coefficient of the polynomial. According to various embodiments, a plurality of blocks of decoded data may be generated based on the coefficients of the polynomial.

According to various embodiments, the block of decoded data may correspond to or may be the at least one coefficient of the polynomial. According to various embodiments, each block of decoded data of the plurality of blocks of decoded data may correspond to or may be one of the coefficients of the polynomial.

According to various embodiments, the decoded data may be generated based on the block of decoded data.

According to various embodiments, the block of decoded data may include or may be an element of a finite field, for example with a number of elements corresponding to a power of 2.

According to various embodiments, a supporting point may be assigned to each of the encoded data items. According to various embodiments, the polynomial may be determined so that the evaluation of the polynomial at a supporting point assigned to an encoded data item of the plurality of data items corresponds to the encoded data item.

According to various embodiments, at least one supporting point of the supporting points assigned to the encoded data items may be or may include an element of a multiplicative group, wherein the multiplicative group may be the finite field without a zero element.

According to various embodiments, a generator of the multiplicative group may be determined.

According to various embodiments, the polynomial may be a polynomial p of the form $$p(X) = \sum_{i=0}^{k-1} p_i X^{2^i},$$

wherein k may be a positive integer, and $p_i$ may be an element of a finite field, for example with a number of elements corresponding to a power of 2, for every integer i between 0 and k−1.

Figure 6:
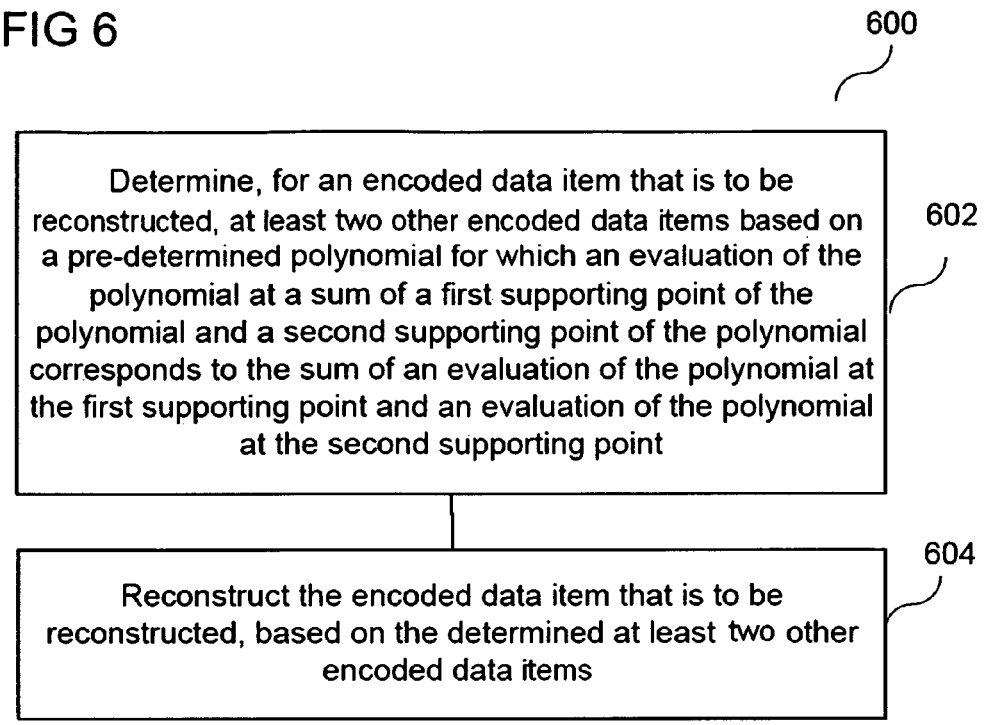
FIG. 6 shows a flow diagram illustrating a data reconstruction method in accordance with an embodiment.

FIG. 6 shows a flow diagram 600 illustrating a data reconstruction method in accordance with an embodiment. In 602, for an encoded data item that is to be reconstructed, at least two other encoded data items may be determined based on a pre-determined polynomial for which an evaluation of the polynomial at a sum of a first supporting point of the polynomial and a second supporting point of the polynomial corresponds to or is equal to the sum of an evaluation of the polynomial at the first supporting point and an evaluation of the polynomial at the second supporting point. In 604, the encoded data item that is to be reconstructed may be reconstructed, based on the determined at least two other encoded data items.

According to various embodiments, a supporting point may be assigned to each of the encoded data item that is to be reconstructed and the at least two other encoded data items.

According to various embodiments, at least one supporting point of the supporting points assigned to each of the encoded data item that is to be reconstructed and the at least two other encoded data items may be an element of a multiplicative group. According to various embodiments, the multiplicative group may be a finite field without a zero element.

According to various embodiments, the polynomial may be a polynomial p of the form $$p(X) = \sum_{i=0}^{k-1} p_i X^{2^i},$$

wherein k may be a positive integer, and $p_i$ may be an element of a finite field, for example with a number of elements corresponding to a power of 2, for every i between 0 and k−1.

According to various embodiments, a generator of the multiplicative group may be determined.

According to various embodiments, for a monomial of a pre-determined degree of the generator, a polynomial of the generator with a degree lower than the pre-determined degree of the monomial may be determined, so that the polynomial corresponds to or is equal to the monomial.

According to various embodiments, the at least two other encoded data items may be determined based on the determining of the polynomial of the generator.

Figure 7:
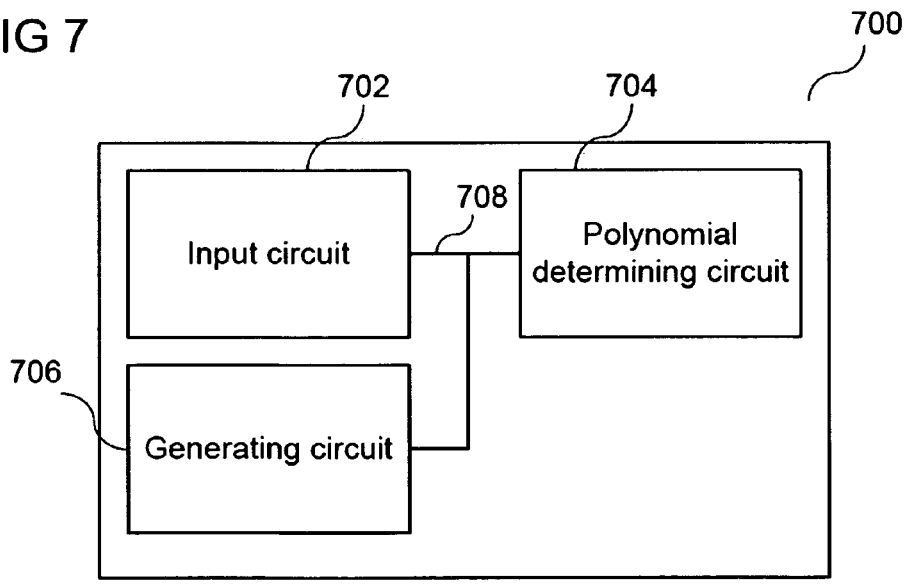
FIG. 7 shows a data encoding device in accordance with an embodiment.

FIG. 7 shows a data encoding device 700 in accordance with an embodiment. The data encoding device 700 may include: an input circuit 702 configured to input data to be encoded; a polynomial determining circuit 704 configured to determine a polynomial so that an evaluation of the polynomial at a sum of a first supporting point of the polynomial and a second supporting point of the polynomial corresponds to or is equal to the sum of an evaluation of the polynomial at the first supporting point and an evaluation of the polynomial at the second supporting point, wherein the coefficients of the polynomial are determined based on the data to be encoded; and a generating circuit 706 configured to generate a plurality of encoded data items by evaluating the polynomial at a plurality of supporting points. The input circuit 702, the polynomial determining circuit 704, and the generating circuit 706 may be coupled with each other, e.g. via an electrical connection 708 such as e.g. a cable or a computer bus or via any other suitable electrical connection to exchange electrical signals.

According to various embodiments, the polynomial determining circuit may further be configured to determine the polynomial so that an evaluation of the polynomial at a product of a value and a third supporting point of the polynomial corresponds to or is equal to the product of the value and an evaluation of the polynomial at the third supporting point. According to various embodiments, the value may be an element of a finite field with a number of elements corresponding to a power of two, and with a number of elements lower than the number of elements of a finite field of which the third supporting point may be an element. According to various embodiments, the third supporting point may be different from the first supporting point and the second supporting point. According to various embodiments, the third supporting point may be equal to the first supporting point or to the second supporting point.

According to various embodiments, the polynomial may be a weakly linearized polynomial, like will be explained in more detail below.

Figure 8:
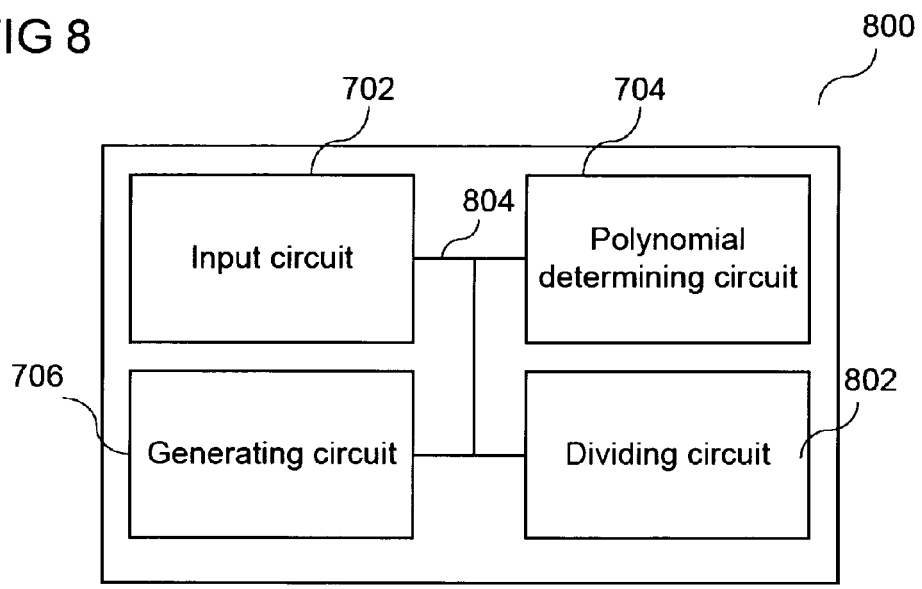
FIG. 8 shows a data encoding device in accordance with an embodiment.

FIG. 8 shows a data encoding device 800 in accordance with an embodiment. The data encoding device 800 may, similar to the data encoding device 700 of FIG. 7, include an input circuit 702, a polynomial determining circuit 704, and a generating circuit 706. The data encoding device 800 may furthermore include a dividing circuit 802, like will be explained in more detail below. The input circuit 702, the polynomial determining circuit 704, the generating circuit 706, and the dividing circuit 802 may be coupled with each other, e.g. via an electrical connection 804 such as e.g. a cable or a computer bus or via any other suitable electrical connection to exchange electrical signals. Various parts of the data encoding device 800 may be similar to or the same as parts of the data encoding device 700 shown in FIG. 7, so that the same reference signs may be used and duplicate description may be omitted.

According to various embodiments, the dividing circuit 802 may be configured to divide the data to be encoded into a plurality of encoding blocks.

According to various embodiments, at least one coefficient of the polynomial may correspond to or may include or may be an encoding block of the plurality of encoding blocks. According to various embodiments, each coefficient of the polynomial may correspond to or may be equal to an encoding block of the plurality of encoding blocks. According to various embodiments, each block of the plurality of blocks may be used in one coefficient of the polynomial.

According to various embodiments, at least one encoding block of the plurality of encoding blocks may include or may be an element of a finite field. According to various embodiments, each encoding block of the plurality of encoding blocks may be or may include an element of the finite field.

According to various embodiments, at least one supporting point of the plurality of supporting points may include or may be an element of a multiplicative group. According to various embodiments, the multiplicative group may be the finite field without a zero element.

According to various embodiments, the data encoding device 800 may further include a generator determining circuit (not shown) configured to determine a generator of the multiplicative group.

According to various embodiments, the polynomial may be a polynomial p of the form $$p(X) = \sum_{i=0}^{k-1} p_i X^{2^i},$$

wherein k may be a positive integer, and $p_i$ may be an element of a finite field, for example with a number of elements corresponding to a power of 2, for every integer i between 0 and k−1.

Figure 9:
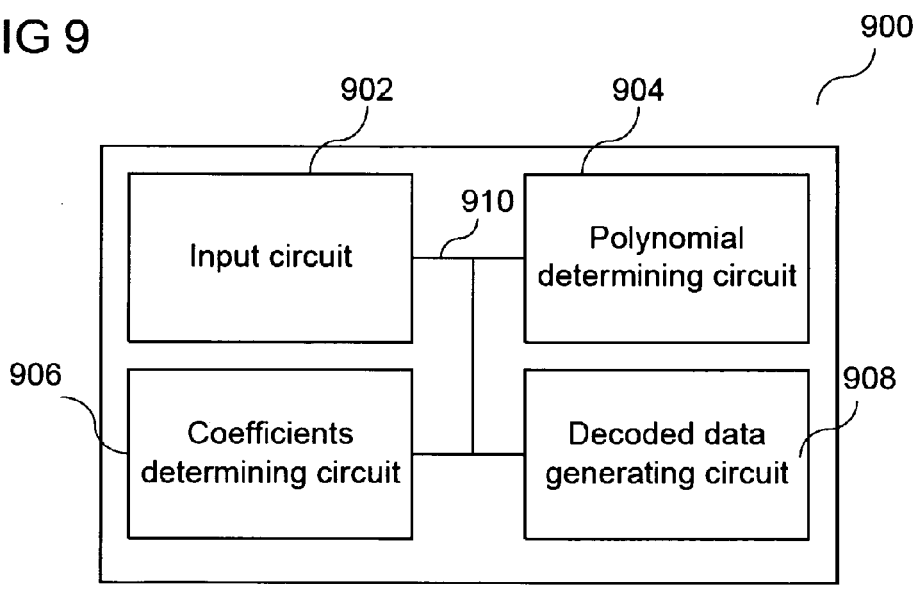
FIG. 9 shows a data decoding device in accordance with an embodiment.

FIG. 9 shows a data decoding device 900 in accordance with an embodiment. The data decoding device 900 may include: an input circuit 902 configured to input a plurality of encoded data items; a polynomial determining circuit 904 configured to determine a polynomial that corresponds to the encoded data items based on a pre-defined similarity criterion so that an evaluation of the polynomial at a sum of a first supporting point of the polynomial and a second supporting point of the polynomial corresponds to or is equal to the sum of an evaluation of the polynomial at the first supporting point and an evaluation of the polynomial at the second supporting point; a coefficients determining circuit 906 configured to determine coefficients of the polynomial; and a decoded data generating circuit 908 configured to generate decoded data based on the coefficients. The input circuit 902, the polynomial determining circuit 904, the coefficients determining circuit 906, and the decoded data generating circuit 908 may be coupled with each other, e.g. via an electrical connection 910 such as e.g. a cable or a computer bus or via any other suitable electrical connection to exchange electrical signals.

According to various embodiments, the polynomial determining circuit 904 may further be configured to determine the polynomial so that an evaluation of the polynomial at a product of a value and a third supporting point of the polynomial corresponds to or is equal to the product of the value and an evaluation of the polynomial at the third supporting point. According to various embodiments. the value may be an element of a finite field with a number of elements corresponding to a power of two, and with a number of elements lower than the number of elements of a finite field of which the third supporting point may be an element. According to various embodiments, the third supporting point may be different from the first supporting point and the second supporting point. According to various embodiments, the third supporting point may be equal to the first supporting point or to the second supporting point.

According to various embodiments, the polynomial may be a weakly linearized polynomial, like will be explained in more detail below.

According to various embodiments, the data decoding device 900 may further include a block generating circuit (not shown) configured to generate a block of decoded data based on at least one coefficient of the polynomial. According to various embodiments, the block generating circuit may be configured to generate a plurality of blocks of decoded data based on the coefficients of the polynomial.

According to various embodiments, the block of decoded data may correspond to or may be the at least one coefficient of the polynomial. According to various embodiments, each block of decoded data of the plurality of blocks of decoded data may correspond to or may be one of the coefficients of the polynomial.

According to various embodiments, the decoded data generator circuit 908 may further be configured to generate the decoded data based on the block of decoded data.

According to various embodiments, the block of decoded data may be or may include an element of a finite field, for example with a number of elements corresponding to a power of 2.

According to various embodiments, a supporting point may be assigned to each of the encoded data items. According to various embodiments, the polynomial determining circuit may be further configured to determine that polynomial so that the evaluation of the polynomial at a supporting point assigned to an encoded data item of the plurality of data items corresponds to or is equal to the encoded data item.

According to various embodiments, at least one supporting point of the supporting points assigned to the encoded data items may be or may include an element of a multiplicative group. According to various embodiments, the multiplicative group may be the finite field without a zero element.

According to various embodiments, the data decoding device 900 may further include a generator determining circuit (not shown) configured to determine a generator of the multiplicative group.

According to various embodiments, the polynomial may be a polynomial p of the form $$p(X) = \sum_{i=0}^{k-1} p_i X^{2^i},$$

wherein k may be a positive integer, and $p_i$ may be an element of a finite field, for example with a number of elements corresponding to a power of 2, for every integer i between 0 and k−1.

Figure 10:
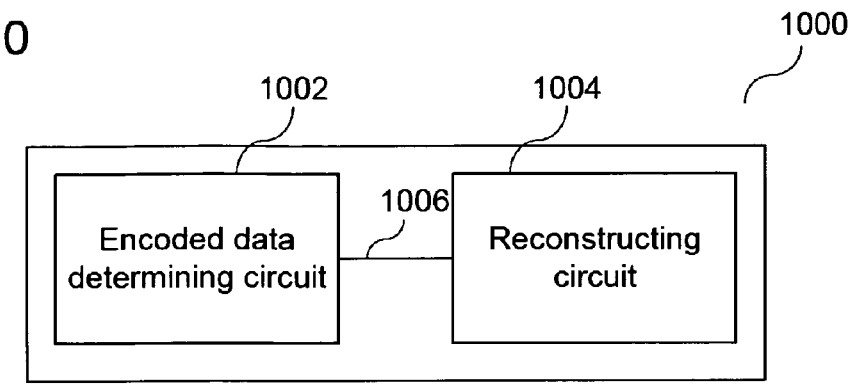
FIG. 10 shows a data reconstruction device in accordance with an embodiment.

FIG. 10 shows a data reconstruction device 1000 in accordance with an embodiment. The data reconstruction device 1000 may include: an encoded data determining circuit 1002 configured to determine, for an encoded data item that is to be reconstructed, at least two other encoded data items based on a pre-determined polynomial for which an evaluation of the polynomial at a sum of a first supporting point of the polynomial and a second supporting point of the polynomial corresponds to or is equal to the sum of an evaluation of the polynomial at the first supporting point and an evaluation of the polynomial at the second supporting point; and a reconstructing circuit 1004 configured to reconstruct the encoded data item that is to be reconstructed, based on the determined at least two other encoded data items. The encoded data determining circuit 1002 and the reconstructing circuit 1004 may be coupled with each other, e.g. via an electrical connection 1006 such as e.g. a cable or a computer bus or via any other suitable electrical connection to exchange electrical signals.

According to various embodiments, a supporting point may be assigned to each of the encoded data item that is to be reconstructed and the at least two other encoded data items.

According to various embodiments, at least one supporting point of the supporting points assigned to each of the encoded data item that is to be reconstructed and the at least two other encoded data items may be an element of a multiplicative group. According to various embodiments, the multiplicative group may be the finite field without a zero element.

According to various embodiments, the polynomial may be a polynomial p of the form $$p(X) = \sum_{i=0}^{k-1} p_i X^{2^i},$$

wherein k may be a positive integer, and $p_i$ may be an element of a finite field, for example with a number of elements corresponding to a power of 2, for every integer i between 0 and k−1.

Figure 11:
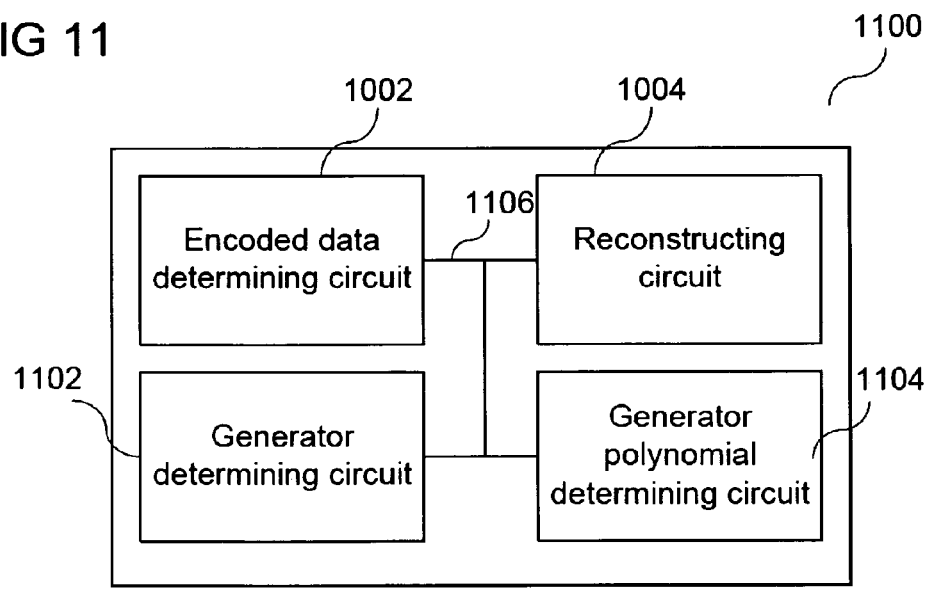
FIG. 11 shows a data reconstruction device in accordance with an embodiment.

FIG. 11 shows a data reconstruction device 1100 in accordance with an embodiment. The data reconstruction device 1100 may, similar to the data reconstruction device 1000 of FIG. 10, include an encoded data determining circuit 1002 and a reconstructing circuit 1004. The data reconstruction device 1100 may further include a generator determining circuit 1102, like will be explained in more detail below. The data reconstruction device 1100 may further include a generator polynomial determining circuit 1104, like will be explained in more detail below. The encoded data determining circuit 1002, the reconstructing circuit 1004, the generator determining circuit 1102, and the generator polynomial generating circuit 1104 may be coupled with each other, e.g. via an electrical connection 1106 such as e.g. a cable or a computer bus or via any other suitable electrical connection to exchange electrical signals.

According to various embodiments, the generator determining circuit 1102 may be configured to determine a generator of the multiplicative group.

According to various embodiments, the generator polynomial determining circuit 1104 may be configured to, for a monomial of a pre-determined degree of the generator, determine a polynomial of the generator with a degree lower than the pre-determined degree of the monomial, so that the polynomial corresponds to or is equal to the monomial.

According to various embodiments, the encoded data determining circuit 1102 may further be configured to determine the at least two other encoded data items based on the determining of the polynomial of the generator.

In an embodiment, a data encoding method may be provided. The data encoding method may include generating a plurality of encoded data items by evaluating a polynomial, which is linear under addition and has coefficients corresponding to data to be encoded, at a plurality of supporting points.

In various embodiments, linear under addition may be understood to correspond to that an evaluation of a sum of points is equal to the sum of evaluation of the respective points.

In an embodiment, a data decoding method may be provided. The data decoding method may include generating decoded data based on the coefficients of a determined polynomial which is linear under addition and has been determined by interpolation based on the encoded data.

In an embodiment, a data reconstruction method may be provided. The data reconstruction method may include reconstructing an encoded data item that is to be reconstructed, based on at least two other encoded data items, which have been determined based on a pre-determined polynomial which is linear under addition.

In an embodiment, a data encoding device may be provided. The data encoding device may include a generating circuit configured to generate a plurality of encoded data items by evaluating a polynomial, which is linear under addition and has coefficients corresponding to data to be encoded, at a plurality of supporting points.

In an embodiment, a data decoding device may be provided. The data decoding device may include a generating circuit configured to generate decoded data based on the coefficients of a determined polynomial which is linear under addition and has been determined by interpolation based on the encoded data.

In an embodiment, a data reconstruction device may be provided. The data reconstruction device may include a reconstruction circuit configured to reconstruct an encoded data item that is to be reconstructed, based on at least two other encoded data items, which have been determined based on a pre-determined polynomial which is linear under addition.

According to various embodiments, devices and methods may be provided for erasure codes to be used for networked data storage systems. Classical (n, k) erasure codes coming from communication have the property that out of k' encoded fragments, the original object may be reconstructed, wherein k' may be larger or equal to k for general codes, and wherein k' may be equal to k for maximum distance separable codes. However, given a missing fragment, this latter may not be recovered from a (relatively) small subset of other fragments present in the network, and the whole object may be desired to be rebuilt first, so as to again recreate the fragment to be replaced.

According to various embodiments, self-repairing codes as a new family of erasure codes which not only have the property of reconstruction of classical erasure codes, but further allow to rebuild missing encoded fragments from others stored in the network may be provided. By analogy with the reconstruction property, self repairing codes may allow any fragment to be repaired out of a fixed number of present fragments, independently of which specific blocks are missing, but depending only on the number of such missing blocks.

According to various embodiments, erasure codes may provide a mapping, called encoding, of k pieces of information data into n>k pieces, adding redundancy with the property that if a portion of the n encoded pieces is erased, the original information data can still be recovered. According to various embodiments, the best possible erasure codes may allow the loss of up till n−k arbitrary encoded pieces.

Erasure codes have originally been studied in the context of communication channels, where a transmitter sends pieces of information over a noisy channel that loses some of the data sent, and the receiver needs to recover the transmitted message out of the pieces it receives.

According to various embodiments, another application of erasure codes is storage. For example, compact discs may use such redundancy for resilience against physical damages. Such redundancy schemes may also be useful in networked storage systems like data-centers, and peer-to-peer or cloud storage.

In an embodiment of network storage, the object to be stored may be encoded using an erasure code, and the n generated fragments of the object may be given to n different nodes in a network. Even if a fraction of the nodes become available, a node which wants to have the whole object may download enough fragments to then reconstruct it.

According to various embodiments, networked distributed storage may benefit from the research done in coding over communication channels by applying erasure codes as black boxes that provide efficient distribution and reconstruction of the stored objects.

According to various embodiments, devices and methods may be provided for a maintenance issue: In a volatile network where nodes may fail, or come online and go offline frequently, different (new) nodes may be provided with fragments of the stored data to compensate for the departure of nodes from the system, and may replenish the level of redundancy (in order to tolerate further faults in future).

Commonly used erasure codes may provide a storage efficient alternative to replication based redundancy in (networked) storage systems. They however may entail high communication overhead for maintenance, when some of the encoded fragments are lost and need to be replenished. Such overheads may arise from the fundamental need to recreate (or keep separately) first a copy of the whole object before any individual encoded fragment can be generated and replenished. Recently, there has been intense interest to explore alternatives, for example regenerating codes (RGC) and hierarchical codes (HC).

According to various embodiments, devices and methods are provided for recreating and storing of an encoded fragment that is lost due to departure or failure of a node.

The naive approach would be for this node (or some other node) to download enough fragments to recover the whole data, out of which it could recompute the missing encoded fragment(s), and then restore it (these) in the system, for example like shown in FIG. 3. Alternatively some node may be desired to maintain a full copy of the object, which may recreate and restore the missing fragments. These may be costly and inefficient solutions: The whole object may be desired to recover even a single missing encoded piece.

According to commonly used methods, encoding two bits into three by XORing the two information bits may have the property that any two encoded bits may be used to recover the third one, and an iterative construction may be used where, starting from small erasure codes, a bigger code, called hierarchical code (HC), may be built by XORing subblocks made by erasure codes or their combinations. Thus a subset of encoded blocks may be enough to regenerate a missing one. However, the size of this subset may vary, from the minimal to the maximal number of encoded subblocks. The size of such a subset may be determined by not only the number of lost blocks, but also the specific blocks lost. This may be because of asymmetric/unequal role and importance of different hierarchically encoded blocks. So, given a number of encoded blocks lost, this strategy may need an arbitrary number of other encoded blocks to carry out a repair.

According to various embodiments, self-repairing codes (SRC) may be provided, which are a family of erasure codes with the properties that: (a) encoded fragments may be repaired directly from other subsets of encoded fragments without having to reconstruct first the original data. Furthermore, for example, based on the analogy with the error correction capability of erasure codes, which may be of any n–k losses independently of which losses, in SRCs, (b) a fragment may be reconstructed from a fixed number of other encoded fragments, the number depending only on how many encoded blocks are missing and independent of which specific blocks are missing in order to improve the maintenance of data storage. In other words: the following properties (a) and (b) may be provided: (a) encoded fragments may be repaired directly from other subsets of encoded fragments without having to reconstruct first the original data, ensuring that (b) a fragment may be repaired from a fixed number of encoded fragments, the number depending only on how many encoded blocks are missing and independent of which specific blocks are missing.

According to various embodiments, devices and methods may be provided for a deterministic self-repairing code construction, for which the desired properties may be achieved in practice. It is to be noted that a deterministic self-repairing code construction may reduce algorithmic and systems complexity of networked storage systems design.

Erasure codes are extensively used in network storage systems, such as data centers, cloud storages, peer-to-peer storages. There are companies working specifically on providing reliable data backup using networked storage. According to various embodiments, self-repairing codes may have lower maintenance overheads (for example, in terms of bandwidth, computation, energy) and associated costs and systems design complexity.

According to various embodiments, self-repairing homomorphic codes for distributed storage systems may be provided.

According to various embodiments, devices and methods may be provided that allow for not only low communication overhead to recreate a missing fragment, but also independent reconstruction of different missing fragments in parallel, for example in different parts of the network. According to various embodiments, a difference between SRCs and HCs may be that different encoded fragments in HCs do not have symmetric roles (in other words: do not have equal importance). Consequently the number of fragments required to replenish a specific fragment in HCs may depend on which specific fragments are missing, and not solely on how many. Likewise, object reconstruction may need different number of fragments depending on which fragments are missing. RGCs may apply network coding over (n, k) erasure codes, and provide network information flow based limits on the minimal maintenance overheads. RGCs need to communicate with at least k other nodes to recreate any fragment, and the minimal overhead may be achieved if only one fragment is missing, and information may be downloaded from all the other n−1 nodes.

According to various embodiments, the static resilience of SRCs with respect to traditional erasure codes may be investigated, like will be explained in more detail below, and it may be observed that SRCs may incur marginally larger storage overhead in order to achieve the aforementioned properties. According to various embodiments, the SRC properties may naturally translate to low communication overheads for reconstruction of lost fragments, and allow reconstruction with lower latency by facilitating repairs in parallel. According to various embodiments, self-repairing codes may be provided for networked distributed storage systems.

Networked storage systems have gained prominence in recent years. These may include various genres, including decentralized peer-to-peer storage systems, as well as dedicated infrastructure based data-centers and storage area networks. Because of storage node failures, or user attrition in a peer-to-peer system, redundancy may be essential in networked storage systems. This redundancy may be achieved using either replication, or (erasure) coding techniques, or a mix of the two. Erasure codes may require an object to be split into k parts, and mapped into n encoded fragments, such that any k encoded fragments may be adequate to reconstruct the original object. Such coding techniques may be provided for providing storage efficient redundancy, and may be particularly effective for storing large data objects and for archival and data back-up applications.

Redundancy may be lost over time because of various reasons such as node failures or attrition, and mechanisms to maintain redundancy may be desired. It may be observed that while erasure codes may be efficient in terms of storage overhead, maintenance of lost redundancy may entail large overheads. A naive approach to replace a single missing fragment may desire that k encoded fragments are first fetched in order to create the original object, from which the missing fragment is recreated and replenished. This means, for every lost fragment, k-fold more network traffic may be incurred when applying such a naive strategy.

Several engineering solutions may partly mitigate the high maintenance overheads. One approach may be to use a 'hybrid' strategy, where a full replica of the object may additionally be maintained. This may ensure that the amount of network traffic equals the amount of lost data. Recent works argue that the hybrid strategy adds storage inefficiency and system complexity. Another possibility is to apply lazy maintenance, whereby maintenance may be delayed in order to amortize the maintenance of several missing fragments.

Lazy strategies may additionally avoid maintenance due to temporary failures. Procrastinating repairs however may lead to a situation where the system becomes vulnerable, and thus may require a much larger amount of redundancy to start with. Furthermore, the maintenance operations may lead to spikes in network resource usage.

It is to be noted at this juncture that erasure codes had originally been designed in order to make communication robust, such that loss of some packets over a communication channel may be tolerated. Network storage has thus benefitted from the research done in coding over communication channels by using erasure codes as black boxes that provide efficient distribution and reconstruction of the stored objects.

Recently, there has been a renewed interest in designing codes that are optimized to deal with the vagaries of networked storage, particularly focusing on the maintenance issue. In a volatile network where nodes may fail, or come online and go offline frequently, new nodes may be desired to be provided with fragments of the stored data to compensate for the departure of nodes from the system, and replenish the level of redundancy (in order to tolerate further faults in future).

According to various embodiments, a new family of codes called self-repairing codes (SRC), which may be used in typical networked storage environments, may be provided.

According to various embodiments, the number of nodes necessary to reduce the reconstruction of a missing block may be minimized, and lower bandwidth consumption may be present, and also lower computational complexity of maintenance, as well as the possibility for faster and parallel replenishment of lost redundancy may be present.

According to various embodiments, a concept of self-repairing codes as (n, k) codes designed to suit networked storage systems, that encode k fragments of an object into n encoded fragments to be stored at n nodes, with the properties explained above may be provided.

According to various embodiments, a family of codes may be provided, which may be referred to as self-repairing codes (SRC), designed as an alternative to erasure codes (EC) for providing redundancy in networked storage systems, which allow repair of individual encoded blocks using only few other encoded blocks. Like ECs, SRCs may also allow recovery of the whole object using k encoded fragments, but unlike in ECs, these are not any arbitrary k fragments. However, numerous specific suitable combinations exist.

According to various embodiments, a deterministic code construction, which may be referred to as Homomorphic Self-Repairing Code (HSRC), may be provided.

According to various embodiments, HSRC self-repair operations may be computationally efficient. It may be done by XORing encoded blocks, each of them including information about all fragments of the object, though the encoding itself may be done through polynomial evaluation, not by XORing.

According to various embodiments, for equivalent static resilience, marginally more storage may be desired than for traditional erasure codes to achieve self-repairing property.

According to various embodiments, the need of few blocks to reconstruct a lost block may translate to low overall bandwidth consumption for repair operations. According to various embodiments, SRCs may allow for both eager as well as lazy repair strategies for equivalent overall bandwidth consumption for a wide range of practical system parameter choices. They may also outperform lazy repair with the use of traditional erasure codes for many practical parameter choices.

According to various embodiments, by providing parallel and independent repair of different encoded blocks, SRCs may facilitate fast replenishment of lost redundancy, allowing a faster system recovery from a vulnerable state than is possible with traditional codes.

According to various embodiments, linear coding through polynomials may be provided.

According to various embodiments, codes for networked storage systems may be provided.

In the following, the mechanisms behind erasure codes design is briefly described. In what follows, $\mathbb{F}_q$ may denote the finite field with q elements, and $\mathbb{F}_q^*$ the finite field without the zero element. If $q=2^m$, an element $x \in \mathbb{F}_q$ may be represented by an m-dimensional vector $x=(x_1, \ldots, x_m)$ where $x_i \in \mathbb{F}_2$, $i=1, \ldots, m$, coming from fixing a basis, namely $x = \sum_{i=1}^{m} x_i w^{i-1}$ where $\{1, w, \ldots, w^{m-1}\}$ forms a $\mathbb{F}_2$-basis of $\mathbb{F}_q$, and w is a root of an irreducible monic polynomial of degree m over $\mathbb{F}_2$. The finite field $\mathbb{F}_2$ may be the two bits $\mathbf{0}$ and $\mathbf{1}$, with addition and multiplication modulo 2.

In the following, erasure codes will be described. A linear (m, k, d) erasure code over a q-ary alphabet may be formally a linear map c: $\mathbb{F}_q^k \to \mathbb{F}_q^n$, $s \mapsto c(s)$ which maps a k-dimensional vector s to an n-dimensional vector c(s). The set C of codewords c(s), $s \in \mathbb{F}_q^k$, may form the code (or codebook). The third parameter d may refer to the minimum distance of the code: $d = \min_{x \neq y \in C} d(x, y)$ where the Hamming distance d(x, y) counts the number of positions at which the coefficients of x and y differ. The minimum distance may describe how many erasures can be tolerated, which may be known to be at most n−k, achieved by maximum distance separable (MDS) codes. MDS codes thus may allow to recover any codeword out of k coefficients.

Let o be an object of size M bits, that is $o \in \mathbb{F}_{2^M}$, and let k be a positive integer such that k divides M. One may write $$o=(o_1, \ldots, o_k), o_i \in \mathbb{F}_{2^{M/k}}$$

which may make use of a (n, k) code over $\mathbb{F}_{2^{M/k}}$, that maps o to an Mn/k-dimensional binary vector x, or equivalently, an n-dimensional vector $$x=(x_1, \ldots, x_n), x_i \in \mathbb{F}_{2^{M/k}}.$$

In the following, Reed-Solomon Codes will be described. Since the work of Reed and Solomon, it is known that linear coding may be done via polynomial evaluation. In short, take an object $o=(o_1, o_2, \ldots, o_k)$ of size M, with each $o_i$ in $\mathbb{F}_{2^{M/k}}$, and create the polynomial $$p(X)=o_1+o_2 X+\ldots o_k X^{k-1} \in \mathbb{F}_{2^{M/k}}[X].$$

Now evaluate p(X) in n elements $\alpha_1, \ldots, \alpha_n \in \mathbb{F}_{2^{M/k}}$, to get the codeword $(p(\alpha_1), \ldots, p(\alpha_n)), n \leq 2^{M/k}-1.$

EXAMPLE 1

Suppose the object $o=(o_1, o_2, o_3, o_4)$ has 4 bits, and we want to make k=2 fragments: $o_1=(o_1, o_2) \in \mathbb{F}_4$, $o_2=(o_3, o_4) \in \mathbb{F}_4$. We use a (3, 2) Reed-Solomon code over $\mathbb{F}_4$, to store the file in 3 nodes. Recall that $\mathbb{F}_4 = \{(\alpha_0, \alpha_1), \alpha_0, \alpha_1 \in \mathbb{F}_2\} = \{\alpha_0 + \alpha_1 w, \alpha_0, \alpha_1 \in \mathbb{F}_2\}$ where $w^2 = w+1$. Thus we may alternatively represent each fragment as: $o_1 = o_1 + o_2 w \in \mathbb{F}_4$, $o_2 = o_3 + o_4 w \in \mathbb{F}_4$. The encoding may be done by first mapping the two fragments into a polynomial $p(X) \in \mathbb{F}_4[X]$:

$p(X) = (o_1 + o_2 w) + (o_3 o_4 w)X,$ and then evaluating p(X) into the three non-zero elements of $\mathbb{F}_4$, to get a codeword of length 3:

$(p(1), p(w), p(w+1))$ where $p(1) = o_1 + o_3 + w(o_2 + o_4)$, $p(w) = o_1 + o_4 + w(o_2 + o_3 + o_4)$, $p(w^2) = o_1 + o_3 + o_4 + w(o_2 + o_3)$, so that each node gets two bits to store: $(o_1 + o_3, o_2 + o_4)$ at node 1, $(o_1 + o_4, o_2 + o_3 + o_4)$ at node 2, $(o_1 + o_3 + o_4, o_2 + o_3)$ at node 3.

In the following, homomorphic codes will be described. Encoding linearly data as explained above may be done with arbitrary polynomials.

According to various embodiments, a particular class of polynomials that may be used in the construction of homomorphic codes, a class of self-repairing codes described in more detail below, may be provided.

According to various embodiments, linearized polynomials may be provided.

According to various embodiments, since we work over finite fields that contains $\mathbb{F}_2$, recall that all operations are done in characteristic 2, that is, modulo 2. Let $a, b \in \mathbb{F}_{2^m}$, for some $m \geq 1$. Then we may have that $(a+b)^2 = a^2 + b^2$ and consequently $$(a+b)^{2^i} = \sum_{j=0}^{2^i} \binom{2^i}{j} a^j b^{2^i - j} = a^{2^i} + b^{2^i}, \quad (1)$$

$i \geq 1$.

According to various embodiments, a linearized polynomial may be defined as follows.

Definition 1: A linearized polynomial p(X) over $\mathbb{F}_q$, $q=2^m$, may have the form $$p(X) = \sum_{i=0}^{k-1} p_i X^{q^i},$$

$p_i \in \mathbb{F}_q.$

According to various embodiments, a weakly linearized polynomial may be defined as follows.

Definition 2: A weakly linearized polynomial p(X) over $\mathbb{F}_q$, $q=2^m$, may have the form $$p(X) = \sum_{i=0}^{k-1} p_i X^{2^i},$$

$p_i \in \mathbb{F}_q.$

We use the notation k since later on it will indeed correspond to the number of data symbols that can be encoded with the proposed scheme.

In the following, a useful property of such polynomials will be described.

Lemma 1: Let $a, b \in \mathbb{F}_{2^m}$ and let p(X) be a weakly linearized polynomial given by $p(X) = \sum_{i=0}^{k-1} p_i X^{2^i}$. We have $p(a+b) = p(a) + p(b).$ Proof: Note that if we evaluate p(X) in an element $a+b \in \mathbb{F}_{2^m}$, we get, using (1), that $$p(a+b) = \sum_{i=0}^{k-1} p_i (a+b)^{2^i} = \sum_{i=0}^{k-1} p_i \left(a^{2^i} + b^{2^i}\right) = p(a) + p(b). \quad \text{q.e.d.}$$

The above lemma may be strengthened by considering instead a polynomial p(X) over $\mathbb{F}_q$, $q=2^m$, of the form:

$$p(X) = \sum_{i=0}^{k-1} p_i X^{s^i},$$

$p_i \in \mathbb{F}_q;$ where $s=2^l$, $1 \leq l \leq m$ (l=m makes p(X) a linearized polynomial).

Then, the following Lemma may hold.

Lemma 2: Let $a, b \in \mathbb{F}_{2^m}$ and let p(X) be the polynomial given by $p(X) = \sum_{i=0}^{k-1} p_i X^{s^i}$, $s=2^l$, $m \geq l \geq 1$. We have $p(ua+vb) = up(a) + vp(b), u, v \in \mathbb{F}_s.$ Proof: If we evaluate p(X) in ua+vb, we get $$p(ua+vb) = \sum_{i=0}^{k-1} p_i (ua+vb)^{s^i} = \sum_{i=0}^{k-1} p_i \left((ua)^{s^i} + (vb)^{s^i}\right)$$

again by (1), and $$p(ua+vb) = \sum_{i=0}^{k-1} p_i \left(ua^{s^i} + vb^{s^i}\right) = u \sum_{i=0}^{k-1} p_i a^{2^i} + v \sum_{i=0}^{k-1} p_i b^{2^i}$$

using the property that $u^s = u$ for $u \in \mathbb{F}_s$. q.e.d.

According to various embodiments, self-repairing codes using weakly linearized polynomials may be provided.

According to various embodiments, to satisfy the definition of self-repairing codes, an instance of explicit coding scheme that fulfills the proposed properties may be provided. According to various embodiments, an encoding procedure may be provided for the object to be stored, based on evaluation of some forms of the above-defined linearized polynomials.

According to various embodiments, the object to be stored may be cut into k fragments, each represented as an element of a finite field, that form the k non-zero coefficients of polynomial, which may then be evaluated in n values of a finite field so as to obtain a map from k fragments to n>k fragments. According to various embodiments, a linearized polynomial may be chosen for achieving the self-repairing properties of the code.

Commonly used erasure codes (for example, Reed-Solomon codes) do not have this property.

In what follows, $\mathbb{F}_q$ may denote the finite field with q elements.

According to various embodiments, data may be encoded by the following steps:
1. Take an object o of length M, with k a positive integer that divides M. Decompose o into k fragments of length M=k:

$o=(o_1,\ldots,o_k); o_i \in \mathbb{F}_{2^{M/k}}$.

2. Take the polynomial, for example a (weakly) linearized polynomial, with coefficients in $\mathbb{F}_{2^{M/k}}$ $$p(X) = \sum_{i=0}^{k-1} p_i X^{2^i},$$

and encode the k fragments as coefficients, namely take $p_i = o_{i+1}$, $i=0, \ldots, k-1$.

3. Evaluate p(X) in n non-zero values $\alpha_1, \ldots, \alpha_n$ of $\mathbb{F}_{2^{M/k}}$ to get a n-dimensional codeword $(p(\alpha_1), \ldots, p(\alpha_n))$.

According to various embodiments, each $p(\alpha_i)$ may be given to some network node i for storage.

According to various embodiments, in order to have a set of pairwise different $p(\alpha_i)$, it may be desired that $$n \leq 2^{M/k} - 1. \quad (2)$$

According to various embodiments, decoding may be performed by performing the following step: Given k linearly independent fragments, the node that wants to reconstruct the file may compute $2^k - 1$ linear combinations of the k fragments, which may give $2^k - 1$ points in which p is evaluated.

According to various embodiments, Lagrange interpolation may guarantee that it is enough to have $2^{k-1} + 1$ points (which we have, since $2^k - 1 \geq 2^{k-1} + 1$) to reconstruct uniquely the polynomial p and thus the data file. This may desire:

$$2^{k-1} + 1 \leq 2^{M/k} - 1. \quad (3)$$

According to various embodiments, a self-repairing property may be provided like will be explained below.

According to various embodiments, a codeword, for example constructed with the procedure explained above, may be of the form $(p(\alpha_1), \ldots, p(\alpha_n))$, where each coefficient may be in $\mathbb{F}_{2^{M/k}}$ and $k < n \leq 2^{M/k} - 1$. In the following, $n_{max}$ may denote the maximum value that n can take, for example $n_{max} = 2^{M/k} - 1$. It may be known that $\mathbb{F}_{2^{M/k}}$ contains a basis $B = \{b_1, \ldots, b_{M/k}\}$ with M/k linearly independent elements.

According to various embodiments, if $\alpha_1, \ldots, \alpha_n$ are contained in B, then the code may have no self-repairing property.

According to various embodiments, if $n = 2^{M/k} - 1$, then the $\alpha_i$, $i=1, \ldots, n$, may be expressed as $\mathbb{F}_2$-linear combinations of the basis elements, and we have from lemma 1 that if $$\alpha_i = \sum_{j=1}^{M/k} \alpha_{ij} b_j,$$

$\alpha_{ij} \in \mathbb{F}_2$, then $$p(\alpha_i) = \sum_{j=1}^{M/k} \alpha_{ij} p(b_j).$$

In words, that means that an encoded fragment may be obtained as a linear combination of other encoded fragments. In terms of computational complexity, this may further imply that the cost of a block reconstruction is that of some XORs (one favorable case, when two terms are enough to reconstruct a block, up to k−1 in the worst case).

According to various embodiments, on the other hand, if $\alpha_1, \ldots, \alpha_n$ are contained in B, then the code may not have a selfrepairing property.

According to various embodiments, for any choice of a positive integer k that divides M, we work in the finite field $\mathbb{F}_{2^{M/k}}$. To do explicit computations in this finite field, it may be convenient to use the generator of the multiplicative group $\mathbb{F}^*_{2^{M/k}} = \mathbb{F}_{2^{M/k}} \setminus \{0\}$, that may be denoted by w. A generator may have the property that $w^{2^{M/k}-1} = 1$, and there may be no smaller positive power of w for which this is true.

EXAMPLE 2

Consider a case of an erasure code with n=4 and k=3 constructed as follows. Take a data file $o=(o_1, \ldots, o_{12})$ of M=12 bits, and choose k=3 fragments. We have that M/k=4, which satisfies $2^2 + 1 = 5 \leq 2^4 - 1 = 15.$ According to various embodiments, the file o may be cut into 3 fragments $o_1 = (o_1, \ldots, o_4)$, $o_2 = (o_5, \ldots, o_8)$, $o_3 = (o_9, \ldots, o_{12}) \in \mathbb{F}_{2^4}$. Let w be a generator of the multiplicative group of $\mathbb{F}_{2^4}$, such that $w^4 = w + 1$. According to various embodiments, the polynomial used for the encoding may be $$p(X) = \sum_{i=1}^{4} o_i w^i X + \sum_{i=1}^{4} o_{i+4} w^i X^2 + \sum_{i=1}^{4} o_{i+8} w^i X^4.$$

According to various embodiments, the n-dimensional codeword may be obtained by evaluating p(X) in n elements of $\mathbb{F}_{2^4}$, $n \leq 15 = n_{max}$ by (2).

If we take n=4 and evaluate the polynomial in $w^i$, i=0; 1; 2; 3, then 4 encoded fragments p(1), p(w), $p(w^2)$, $p(w^3)$ are linearly independent and there is no self-rep air possible.

According to various embodiments, the case of another erasure code, now with n=7 and again k=3 may be considered, for example, 1, w, $w^2$, $w^4$, $w^5$, $w^8$, $w^{10}$, we get:

$(p(1), p(w), p(w^2), p(w^4), p(w^5), p(w^8), p(w^{10}))$.

Note that $w^4 = w + 1$ $w^5 = w^2 + w$ $w^6 = w^3 + w^2$ $w^7 = w^3 + w + 1$ $w^8 = w^2 + 1$ $w^9 = w^3 + w$ $w^{10} = w^2 + w + 1$ $w^{11} = w^3 + w^2 + w$ $w^{12} = w^3 + w^2 + w + 1$ $w^{13} = w^3 + w^2 + 1$ $w^{14} = w^3 + 1$ $w^{15} = 1$.

According to various embodiments, the self-repair may work like will be described in the following for this example code. Suppose node 5, which stores p(w5), becomes unavailable. We, or a new corner, can still get p(w5) by asking for p(w2) and p(w), since $$p(w^5) = p(w^2 + w) = p(w^2) + p(w).$$

Thus, in this case only two encoded blocks was adequate to retrieve one missing block, instead of three blocks which are needed to reconstruct the whole object. Such two blocks may be found corresponding to any specific missing block in this example. In fact there may be multiple such pairs to reconstruct a specific block. One pair instance to reconstruct any specific missing block for this example code is shown below:

| Missing block | Example block pair supporting repair |
| --- | --- |
| w | $w^2, w^5$ |
| $w^2$ | $w, w^5$ |
| $w^3$ | $w^2, w^6$ |
| $w^4$ | $w^3, w^7$ |
| $w^5$ | $w, w^2$ |
| $w^6$ | $w^2, w^3$ |
| $w^7$ | $w^3, w^4$ |

Table I shows other examples of missing fragments and which pairs can reconstruct them, depending on if 1, 2, or 3 fragments are missing at the same time.

TABLE I

WAYS OF RECONSTRUCTING MISSING FRAGMENT(S) IN EXAMPLE 2

| missing fragment(s) | pairs to reconstruct missing fragment(s) |
| --- | --- |
| p(1) | $(p(w), p(w^4))$; $(p(w^2), p(w^8))$; $(p(w^5), p(w^{10}))$ |
| p(w) | $(p(1), p(w^4))$; $(p(w^2), p(w^5))$; $(p(w^8), p(w^{10}))$ |
| $p(w^2)$ | $(p(1), p(w^8))$; $(p(w), p(w^5))$; $(p(w^4), p(w^{10}))$ |
| p(1) and p(w) | $(p(w^2), p(w^8))$ or $(p(w^5), p(w^{10}))$ for p(1) $(p(w^8), p(w^{10}))$ or $(p(w^2), p(w^5))$ for p(w) |
| p(1) and $p(w^2)$ | $(p(w^5), p(w^{10}))$ for p(1) |
| p(w) and $p(w^2)$ | $(p(w^8), p(w^{10}))$ for p(w) $(p(w^4), p(w^{10}))$ for $p(w^2)$ |

According to various embodiments, the decoding to reconstruct the object for this example may be performed as will be described in the following. Since p(X) is of degree 4, according to various embodiments, a node that wants to recover the data may desired to have k=3 linearly independent fragments, say p(w), $p(w^2)$, $p(w^3)$, out of which it may generate $p(aw + bw^2 + cw^3)$, a, b, c ∈ {0,1}. Out of the 7 non-zero coefficients, 5 of them may be enough to recover p(X). Note that these 5 coefficients may be obtained from the three encoded fragments as shown.

According to various embodiments, the construction may be used to generate erasure codes with other (larger) values of n and k, as well as other constant sized subsets to recreate a specific block when any one arbitrary block is missing. Furthermore, according to various embodiments, the construction also naturally generalizes, so that again a constant sized subset (but more than two, and determined only by the total number of missing blocks, but not on which specific blocks) may be adequate to reconstruct all these missing blocks (as long as the number of missing blocks is smaller than n–k).

According to various embodiments, again with n=7, $w^i$, i=1, ..., 7 may be considered, and then we get:

(p)(w), ... ,p(w7)).

As a further example, the following other 7 fragments could have been taken:

$(p(1), p(w^3), p(w^4), p(w^{14}), p(w), p(w^7), p(w^9))$.

According to various embodiments, in the above example, instead of the generator w chosen such that $w^4 = w + 1$, another generator v could have been taken so that $v^4 = v^3 + 1$.

According to various embodiments, another example may be as follows: take M=4, k=2, that is the object of length M is cut into two fragments (o1,o2),(o3,o4).

According to various embodiments, the polynomial $$p(X) = (o_1 + wo_2)X + (o_3 + wo_4)X^2$$

may be created where $w^2 = w + 1$. According to various embodiments, n=3 may be taken, and evaluated:

$p(1), p(w), p(w^2)$.

This may satisfy $n \leq 2^{M/k} - 1 = 2^2 - 1 = 3$ and $2 + 1 = 3 \leq 2^2 - 1$.

Figure 12:
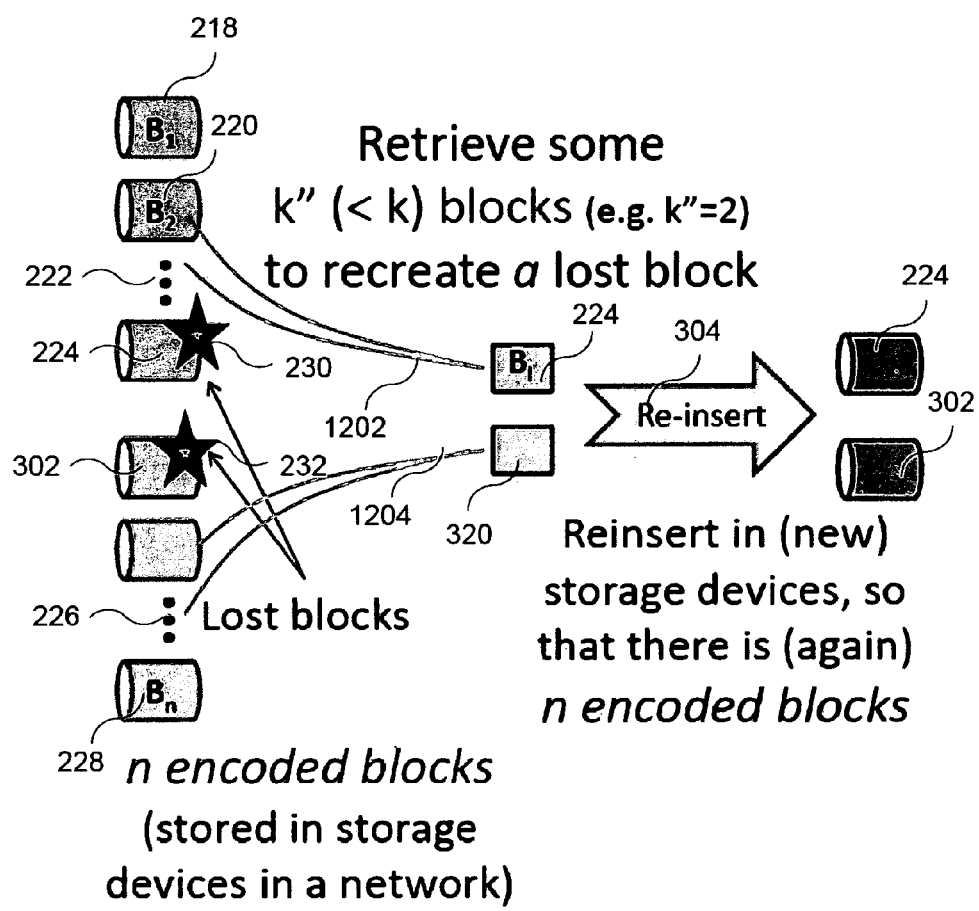
FIG. 12 shows an illustration of data reconstruction in accordance with an embodiment.

FIG. 12 shows an illustration 1200 of data reconstruction in accordance with an embodiment. In the illustration 1200, a reconstruction of lost redundancy is shown when using self-repairing codes (SRC) in accordance with various embodiments. Various elements of the illustration 1200 may be similar to elements shown in the illustration 300 of FIG. 3, and the same reference signs may be used and duplicate description may be omitted. The illustration 1200 shows how, using self-repairing codes, a missing block may be created on the fly using only a small subset of other blocks, without the need to either download enough blocks to create a copy of the object, or having to keep separately such a complete copy. According to various embodiments, the size of this subset may be determined by the number of unavailable blocks, but independent of which specific blocks are unavailable.

According to various embodiments, as shown in the above example, given k fragments, there may be different values of n up to $n_{max}$, and different choices of $\{\alpha_1, \ldots, \alpha_n\}$ that can be chosen to define a self-repairing code. According to various embodiments, the set of $\alpha_i$ may be chosen to form a subspace of $\mathbb{F}_{n^{max}}$. This choice may results in a structure of the code, for example an XOR-like structure.

According to various embodiments, though the encoded fragments may be obtained as XORs of each other, each fragment may actually be containing information about all the different fragments, which may be very different than a simple XOR of the data itself.

In the following, this code may be referred to as Homomorphic SRC, and may be written as HSRC(n, k) to emphasize the code parameters. The analysis that follows refers to this family of self-repairing codes.

In the following, the static resilience analysis of various codes in accordance with various embodiments will be described and homomorphic self-repairing codes in accordance with various embodiments will be analysed. Static resilience of a distributed storage system may be defined as the probability that an object, once stored in the system, will continue to stay available without any further maintenance, even when a certain fraction of individual member nodes of the distributed system become unavailable. As a first evaluation of the proposed scheme, a static resilience analysis, where it is studied how a stored object can be recovered using HSRCs, compared with commonly used erasure codes will be described, prior to considering the maintenance process, which will be described in more detail afterwards.

Let $p_{frag}$ be the probability that any specific node is available. Then, under the assumptions that node availability is i.i.d (an independent and identically distributed random variable), and no two fragments of the same object are placed on any same node, it may be considered that the availability of any fragment is also i.i.d with probability $p_{frag}$.

In the following, a network matrix representation will be described.

Recall that using the above coding strategy, an object o of length M is decomposed into k fragments of length M/k:

$$o=(o_1, \ldots, o_k), o_i \in \mathbb{F}_{2^{M/k}},$$

which are further encoded into n fragments of same length:

$$p=(p_1, \ldots, p_n) \in \mathbb{F}_{2^{M/k}},$$

each of the encoded fragment $p_i$ is given to a node to be stored. We thus have n nodes each possessing a binary vector of length M/k, which can be represented as an n×M/k binary matrix $$\mathbb{M} = \begin{pmatrix} p_1 \\ \vdots \\ p_n \end{pmatrix} = \begin{pmatrix} p_{1,1} & \cdots & p_{1,M/k} \\ & \vdots & \\ p_{n,1} & \cdots & p_{n,M/k} \end{pmatrix} \quad (4)$$

with $p_{ij} \in \mathbb{F}_2$.

EXAMPLE 3

In Example 2, we have for n=4 that $\mathbb{M}=I_4$, the 4-dimensional identity matrix, while for n=7, it is $$\mathbb{M}^T = \begin{pmatrix} 1 & 0 & 0 & 1 & 0 & 1 & 1 \\ 0 & 1 & 0 & 1 & 1 & 0 & 1 \\ 0 & 0 & 1 & 0 & 1 & 1 & 1 \\ 0 & 0 & 0 & 0 & 0 & 0 & 0 \end{pmatrix}.$$

Thus unavailability of a random node is equivalent to losing a random row of the matrix M. If multiple random nodes (say n−x) become unavailable, then the remaining x nodes provide x encoded fragments, which can be represented by a x×M/k sub-matrix $\mathbb{M}_x$ of $\mathbb{M}$. For any given combination of such x available encoded fragments, the original object may still be reconstructed if we can obtain at least k linearly independent rows of $\mathbb{M}_x$. This may be equivalent to say that the object can be reconstructed if the rank of the matrix $\mathbb{M}_x$ is larger than or equal to k.

In the following, a probability of object retrieval will be described.

Consider a (2d−1)×d binary matrix for some d>1, with distinct rows, no all zero row, and thus rank d. If we remove some of the rows uniformly randomly with some probability 1−$p_{frag}$, then we are left with a x×d sub-matrix—where x is binomially distributed. We define R(x, d, r) as the number of x×d sub-matrices with rank r, voluntarily including all the possible permutations of the rows in the counting.

Lemma 3: Let R(x, d, r) be the number of x×d submatrices with rank r of a tall (2d−1)×d matrix of rank d. We have that R(x, d, r)=0 when (i) r=0, (ii) r>x, (iii) r=x, with x>d, or (iv) r<x but r>d. Then, counting row permutations:

$$R(x, d, r) = \prod_{i=0}^{r-1} (2^d - 2^i)$$

if $$r = x, x \leq d,$$

and for r<x with r≤d:

$$R(x,d,r)=R(x-1,d,r-1)(2^d-2^{r-1})+R(x-1,d,r)(2^r-x).$$

Proof: There are no non-trivial matrix with rank r=0. When r>x, r=x with x>d, or r<x but r>d, R(x, d, r)=0 since the rank of a matrix cannot be larger than the smallest of its dimensions.

For the case when r=x, with x≤d, we deduce R(x, d, r) as follows. To build a matrix $\mathbb{M}_x$ of rank x=r, the first row can be chosen from any of the $2^d-1$ rows in $\mathbb{M}$, and the second row should not be a multiple of the first row, which gives $2^d-2$ choices. The third row needs to be linearly independent from the first two rows. Since there are $2^2$ linear combinations of the first two rows, which includes the all zero vector which is discarded, we obtain $2^d-2^2$ choices. In general, the (i+1)st row can be chosen from $2^d-2^i$ options that are linearly independent from the i rows that have already been chosen. We thus obtain R(x, d, r)=$\Pi_{i=0}^{r-1}(2^d-2^i)$ for r=x, x≤d.

For the case where r<x with r≤d, we observe that x×d matrices of rank r can be inductively obtained by either (I) adding a linearly independent row to a (x−1)×d matrix of rank r−1, or (II) adding a linearly dependent row to a (x−1)×d matrix of rank r. We use this observation to derive the recursive relation $$R(x,d,r)=R(x-1,d,r-1)(2^d-2^{r-1}-1)+R(x-1,d,r)(2r-x),$$

where $2^d-1-(2^{r-1}-1)$ counts the number of linearly independent rows that can be added, and $2^r-1-(x-1)$ is on the contrary the number of linearly dependent rows. q.e.d.

In the following, the permutations that have been counted in the above analysis will be removed by introducing a suitable normalization.

Corollary 1: Let ρ(x,d,r) be the fraction of sub-matrices of dimension x×d with rank r out of all possible sub-matrices of the same dimension. Then $$\rho(x, d, r) = \frac{R(x, d, r)}{\sum_{j=0}^{d} R(x, d, j)} = \frac{R(x, d, r)}{C_x^{2^d-1} x!}.$$

Proof: It is enough to notice that there are $C_x^{2^d-1}$ ways to choose x rows out of the possible $2^d-1$ options. The chosen x rows can be ordered in x! permutations. Q.e.d.

In the following, the above results will be put together to compute the probability $p_{obj}$ of an object being recoverable when using an HSRC(n, k) code to store a length M object made of k fragments encoded into n fragments each of length M/k.

Corollary 2: Using an HSRC(n, k), the probability $p_{obj}$ of recovering the object is $$p_{obj} = \sum_{x=k}^{n} \sum_{r=k}^{d} \rho(x, d, r) C_x^n p_{frag}^x (1 - p_{frag})^{n-x},$$

where $d = \log_2 n + 1$.

Proof: If $n = n_{max} = 2^{M/k} - 1$, we apply Lemma 3 and Corollary 1 with $d = M/k$. If $n = 2^i - 1$, for some integer $i \leq M/k$ such that $n > k$ (otherwise there is no encoding), then $\tilde{M}$ has M/k−i columns which are either all zeros or all ones vectors, as shown on Example 3. Thus the number of its sub-matrices of rank r is given by applying Lemma 3 on the matrix obtained by removing these redundant columns. q.e.d.

Figure 13:
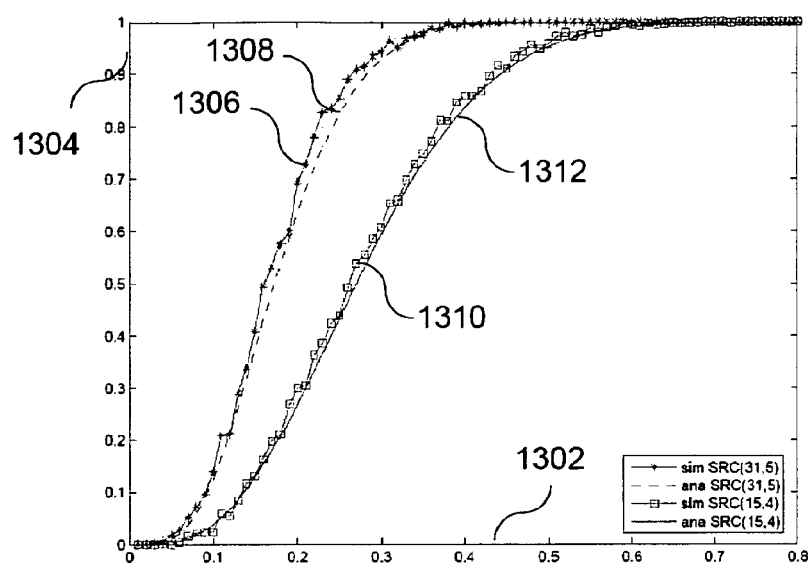
FIG. 13 shows a diagram illustrating a validation of static resilience analysis of various methods in accordance with various embodiments.

FIG. 13 shows a diagram 1300 illustrating a validation of static resilience analysis of various methods in accordance with various embodiments. In the diagram 1300, validation of the analysis with simulations is shown. On the horizontal axis 1302, $p_{frag}$ is shown, and on the vertical axis 1304, $p_{obj}$ 1 is shown, so that the diagram 1300 shows a validation of the static resilience analysis of SRC. A line 1306 with stars shows results of a simulation of the SRC(31,5) (in other words: an SRC with n=31 and k=5 like described above). A dashed line 1308 shows results of an analysis of the SRC(31,5). A line 1310 with squares shows results of a simulation of the SRC (15,4). A line 1312 shown in solid line shows results of an analysis of the SRC(15,4). As can be observed from the diagram 1300, a precise match may be obtained between analysis and simulations.

In the following, a comparison of codes in accordance with various embodiments with commonly used erasure codes will be described.

Let us compare the storage overhead of the proposed scheme against standard erasure codes. If we use a (n, k) erasure code, then the probability that the object is recoverable is:

$$p_{obj} = \sum_{i=k}^{n} C_i^n p_{frag}^i (1 - p_{frag})^{n-i}.$$

Figure 14:
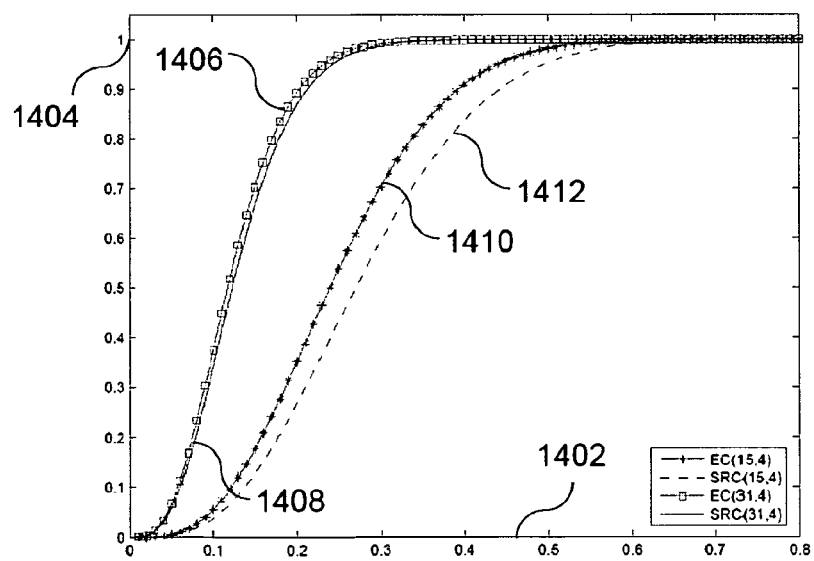
FIG. 14 shows a diagram illustrating a comparison of various methods in accordance with various embodiments.

FIG. 14 shows a diagram 1400 illustrating a comparison of various methods in accordance with various embodiments. On the horizontal axis 1402, $p_{frag}$ is shown and on the vertical axis 1404, $p_{obj}$ is shown, so that the diagram 1400 shows a comparison of SRC with EC. A line 1406 with squares shows results for an EC(31,4) (in other words: an EC with n=31 and k=4, like described above). A solid line 1408 shows results for an SRC(31,4). A line 1410 with stars shows results for an EC(15,4). A dashed line 1412 shows results for an SRC(15,4).

Figure 15:
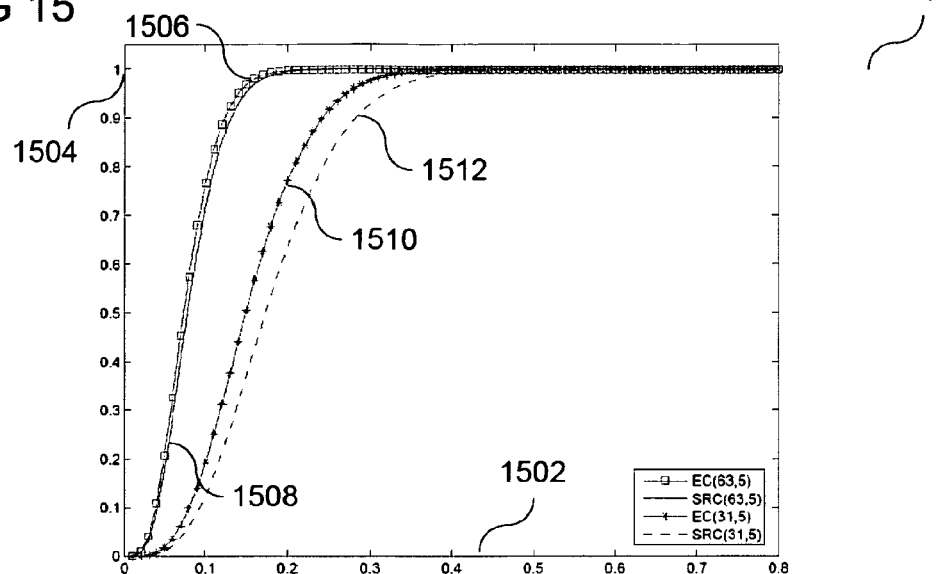
FIG. 15 shows a diagram illustrating a comparison of various methods in accordance with various embodiments.

FIG. 15 shows a diagram illustrating a comparison of various methods in accordance with various embodiments. On the horizontal axis 1502, $p_{frag}$ is shown and on the vertical axis 1504, $p_{obj}$ is shown, so that the diagram 1500 shows a comparison of SRC with EC. A line 1506 with squares shows results for EC(63,5). A solid line 1508 shows results for an SRC(63,5). A line 1510 with stars shows results for an EC(31, 5). A dashed line 1512 shows results for an SRC(31,5).

As shown in FIGS. 14 and 15, the static resilience achieved using the proposed homomorphic SRC with that of traditional erasure codes (EC) is compared.

In order to achieve the self-repairing property in SRC according to various embodiments, it may be desired to introduce extra 'redundancy' in its code structure, but it is to be noticed from the comparisons that this overhead is in fact marginal. For the same storage overhead n/k, the overall static resilience of SRC is only slightly lower than that of EC, and furthermore, for a fixed k, as the value of n increases, SRC's static resilience gets very close to that of EC. Furthermore, even for low storage overheads, with relatively high $p_{frag}$, the probability of object availability is indeed 1. In any storage system, there may be a maintenance operation to replenish lost fragments (and hence, the system may operate for high values of $p_{frag}$). Like will be explained below, SRCs according to various embodiments may have significantly lower maintenance overheads. These may make SRCs a practical coding scheme for networked storage.

In the following, communication overheads of self-repair will be described.

In the above, the probability of recovering an object if it so happens that only $p_{frag}$ fraction of nodes which had originally stored the encoded fragments continue to remain available has been described, while lost redundancy is yet to be replenished. Such a situation may arise either because a lazy maintenance mechanism is applied, which triggers repairs only when redundancy is reduced to certain threshold, or else because of multiple correlated failures before repair operations may be carried out. In the following, the communication overheads in such embodiments will be investigated. It is to be noted that this may be really the regime in which we need an analysis, since in absence of correlated failures, and assuming that an eager repair strategy is applied, whenever one encoded block is detected to be unavailable, it is immediately replenished. The HSRC in accordance with various embodiments may ensures that this one missing fragment can be replenished by obtaining only two other (appropriate) encoded fragments, thanks to the HSRC subspace structure.

Definition 3: The diversity δ of SRC may be defined as the number of mutually exclusive pairs of fragments which can be used to recreate any specific fragment.

In Example 2, it can be seen easily that δ=3. Let us assume that p(w) is missing. Any of the three exclusive fragment pairs, namely $((p(1), p(w^4)); (p(w^2), p(w^5))$ or $(p(w^8), p(w^{10})))$ may be used to reconstruct p(w). See Table I for other examples.

Lemma 4: The diversity δ of a HSRC(n, k) is (n−1)/2. Proof: We have that $n = 2^d - 1$ for some suitable d. The polynomial p(x) is evaluated in $\alpha = \sum_{i=0}^{d-1} a_i w^i$, where $a_i \in \{0, 1\}$ and $(a_0, \ldots, a_{d-1})$ takes all the possible $2^d$ values, but for the whole zero one. Thus for every a, we can create the pairs (α+β,β) where β takes $2^d - 2$ possible values, that is all values besides 0 and α. This gives 2d−2 (which is equal to n−1) pairs, but since pairs (α+β,β) and (β,α+β) are equivalent, we have (n−1)/2 distinct such pairs. q.e.d.

In the following, a further property of SRC in accordance with various embodiments, that may be inferred from its diversity, will be described.

Corollary 3: For a Homomorphic SRC, if at least (n+1)/2 fragments are available, then for any of the unavailable fragments, there exists some pair of available fragments which is adequate to reconstruct the unavailable fragment. Proof: Consider any arbitrary missing fragment α. If up to (n−1)/2 fragments were available, in the worst case, these could belong to the (n−1)/2 exclusive pairs. However, if an additional fragment is available, it will be paired with one of these other fragments, and hence, there will be at least one available pair with which a can be reconstructed.

Q.e.d

In the following, overheads of recreating one specific missing fragment will be described.

Recall that x is defined as the number of fragments of an object that are available at a given time point. For any specific missing fragment, any one of the corresponding mutually exclusive pairs may be adequate to recreate the said fragment. From Corollary 3 we know that if $x \geq (n+1)/2$ then two downloads are enough. Otherwise, we need a probabilistic analysis. Both nodes of a specific pair are available with probability $(x/n)^2$. The probability that only two fragments are enough to recreate the missing fragment is $p_2 = 1 - (1 - (x/n)^2)^\delta$.

If two fragments are not enough to recreate a specific fragment, it may still be possible to reconstruct it with larger number of fragments. A loose upper bound can be estimated by considering that if 2 fragments are not adequate, k fragments need to be downloaded to reconstruct a fragment (note that in fact, often fewer than k fragments will be adequate to reconstruct a specific fragment), which happens with a probability $1 - p_2 = (1 - (x/n)^2)^\delta$.

Thus the expected number $D_X$ of fragments that need to be downloaded to recreate one fragment, when x out of the n encoded fragments are available, can be determined as:

$$D_x = 2 \text{ if } x \geq (n+1)/2$$

$$D_x < 2p_2 + k(1-p_2) \text{ if } x < (n+1)/2.$$

In the following, overhead of recreating all missing fragments will be described.

Above, the overheads to recreate one fragment have been studied. All the missing fragments may be repaired, either in parallel (distributed in different parts of the network) or in sequence. If all missing fragments are repaired in parallel, then the total overhead $D_{pr1}$ of downloading necessary fragments is:

$$D_{pr1} = (n-x) D_X.$$

If they are recreated sequentially, then the overhead $D_{seq}$ of downloading necessary fragments is:

$$D_{seq} = \sum_{i=x}^{n} D_i.$$

In order to directly compare the overheads of repair for different repair strategies—eager, or lazy parallelized and lazy sequential repairs using SRC, as well as lazy repair with traditional erasure codes, consider that lazy repairs are triggered when a threshold $x = x_{th}$ of available encoded fragments out of n is reached. If eager repair were used for SRC encoded objects, download overhead of $$D_{egr} = 2(n - x_{th})$$

may be incurred. Note that, when SRC is applied, the aggregate bandwidth usage for eager repair as well as both lazy repair strategies is the same, assuming that the threshold for lazy repair $x_{th} \geq (n+1)/2$.

In the setting of traditional erasure codes, let us assume that one node downloads enough (k) fragments to recreate the original object, and recreates one fragment to be stored locally, and also recreates the remaining $n - x_{th} - 1$ fragments, and stores these at other nodes. This leads to a total network traffic:

$$D_{EClazy} = k + n - x_{th} - 1.$$

Eager strategy using traditional erasure codes may incur k downloads for each repair, which may obviously be worse than all the other scenarios, so we ignore it in our comparison.

Note that if less than half of the fragments are unavailable, as observed in Corollary 3, downloading two blocks may be adequate to recreate any specific missing fragment. When too many blocks are already missing, applying a repair strategy analogous to traditional erasure codes, that of downloading k blocks to recreate the whole object, and then recreate all the missing blocks may be logical. That is to say, the benefit of reduced maintenance bandwidth usage for SRC (as also of other recent techniques like RGC) only may make sense under a regime when not too many blocks are unavailable. Let us define $x_c$ as the critical value, such that if the threshold for lazy repair in traditional erasure codes $x_{th}$ is less than this critical value, then, the aggregate fragment transfer traffic to recreate missing blocks may be less using the traditional technique (of downloading k fragments to recreate whole object, and then replenish missing fragments) than by using SRC according to various embodiments. Recall that for $x \geq (n+1)/2$, $D_{egr} = D_{pr1} = D_{seq}$. One can determine $x_c$ as follows. We need $D_{egr} \leq D_{EClazy}$, implying that $$2n - 2x_c \leq n - 1 + k - x_c \Rightarrow x_c = n + 1 - k.$$

Figure 16:
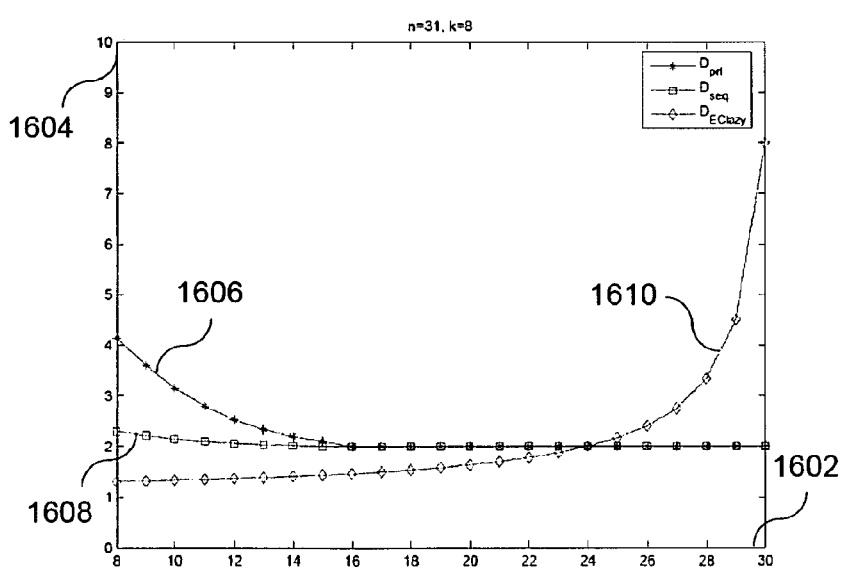
FIG. 16 shows a diagram illustrating a comparison of various methods in accordance with various embodiments.

FIG. 16 shows a diagram 1600 illustrating a comparison of various methods in accordance with various embodiments. In the diagram 1600, on a horizontal line 1602, $x_{th}$ is shown, and on a vertical line 1604 a repair traffic per lost fragments is shown, so that the diagram 1600 shows the average traffic per lost block for various choices of $x_{th}$. Furthermore, in the diagram 1600, the average amount of network traffic to transfer encoded fragments per lost fragment is shown when the various lazy variants of repair are used, namely parallel (shown by a line 1606 with stars) and sequential (shown by a line 1608 with squares) repairs with SRC, and (by default, sequential) repair when using EC (shown by a line 1610 with diamonds). For each of the types of codes, n=31 and k=8, for example, SRC(31,8) and EC(31,8) may be used for the results shown in diagram 1600. The x-axis may represent the threshold $x_{th}$ for lazy repair, such that repairs are triggered only if the number of available blocks for an object is not more than $x_{th}$. Use of an eager approach with SRC may incur a constant overhead of two fragments per lost block.

It is to be noted that there may be other messaging overheads to disseminate necessary meta-information (e.g., which node stores which fragment), but these may be ignored in FIG. 16, considering that the objects being stored are large, and data transfer of object fragments dominates the network traffic. This assumption may be reasonable, since for small-objects, it is well known that the meta-information storage overheads outweigh the benefits of using erasures, and hence erasures are impractical for small objects.

There may be several quantitative and qualitative implications of the above observed behaviors. To start with, it is to be noted that an engineering solution like lazy repair which advocates waiting before repairs are triggered, amortizes the repair cost per lost fragment, and is effective in reducing total bandwidth consumption and outperforms SRC (in terms of total bandwidth consumption), provided the threshold of repair $x_{th}$ is chosen to be lower than $x_c$. This is in itself not surprising. However, for many typical choices of (n, k) in deployed systems such as (16, 10), or (517, 100), a scheme like SRC may be practical. In the former scenario, $x_c$ may be too low, and waiting so long may make the system too vulnerable to any further failures (i.e., poor system health). In the later scenario, that is, waiting for hundred failures before triggering repairs seems both unnecessary, and also, trying to repair 100 lost fragments simultaneously may lead to huge bandwidth spikes. The system's vulnerability to further failures, as well as spiky bandwidth usage may be known problems of lazy repair strategies.

According to various embodiments, using SRC according to various embodiments may allow for a flexible choice of either an eager or lazy (but with much higher threshold $x_{th}$) approaches to carry out repairs, where the repair cost per lost block may stay constant for a wide range of values (up till $x_{th} \leq (n+1)/2$). Such a flexible choice may make it easier to also benefit from the primary advantage of lazy repair in peer-to-peer systems, namely, to avoid unnecessary repairs due to temporary churn, without the drawbacks of (i) having to choose a threshold which leads to system vulnerability or (ii) choose a much higher value of n in order to deal with such vulnerability, and (iii) have spiky bandwidth usage.

In the following, a qualitative discussion of fast parallel repairs using SRC will be described.

It has been observed, like described above, that while SRC is effective in significantly reducing bandwidth usage to carry out maintenance of lost redundancy in coding based distributed storage systems, depending on system parameter choices, an engineering solution like lazy repair while using traditional EC may (or not) outperform SRC in terms of total, bandwidth usage, even though using lazy repair with EC entails several other practical disadvantages.

According to various embodiments, a further feature of SRC according to various embodiments, which will be further showcased in the following, may be the possibility to carry out repairs of different fragments independently and in parallel (and hence, quickly). If repair is not fast, it may be possible that further faults occur during the repair operations, leading to both performance deterioration as well as, potentially, loss of stored objects.

Consider the following scenario for ease of exposition: Assume that each node in the storage network has an uplink/downlink capacity of 1 (coded) fragment per unit time. Further assume that the network has relatively (much) larger aggregate bandwidth. Such assumptions correspond reasonably with various networked storage system environments.

Consider that for the Example 2, originally n was chosen to be $n_{max}$, that is to say, a HSRC(15, 3) was used. Because of some reasons (e.g., lazy repair or correlated failures), let us say that seven encoded fragments, namely $p(1), \ldots, p(w^6)$ are unavailable while fragments $p(w^7) \ldots p(w^{15})$ are available. Table II enumerates possible pairs to reconstruct each of the missing fragments.

TABLE II

SCENARIO: SEVEN FRAGMENTS $p(1), \ldots, p(w^6)$ ARE MISSING

| fragment | suitable pairs to reconstruct |
|---|---|
| p(1) | $(p(w^7), p(w^9)); (p(w^{11}), p(w^{12}))$ |
| p(w) | $(p(w^7), p(w^{14})); (p(w^8), p(w^{10}))$ |
| $p(w^2)$ | $(p(w^7), p(w^{12})); (p(w^9), p(w^{11})); (p(w^{12}), p(w^{10}))$ |
| $p(w^3)$ | $(p(w^8), p(w^{13})); (p(w^{10}), p(w^{12}))$ |
| $p(w^4)$ | $(p(w^9), p(w^{14})); (p(w^{11}), p(w^{13}))$ |
| $p(w^5)$ | $(p(w^7), p(w^{13})); (p(w^{12}), p(w^{14}))$ |
| $p(w^6)$ | $(p(w^7), p(w^{10})); (p(w^8), p(w^{14}))$ |

According to various embodiments, a potential schedule to download the available blocks at different nodes to recreate the missing fragments may be as follows: In first time slot, $p(w^{11}), p(w^{10}), p(w^{12})$, nothing, $p(w^{13}), p(w^7)$ and $p(w^8)$ may be downloaded separately by seven nodes trying to recreate each of $p(1), \ldots, p(w^6)$ respectively. In second time slot $p(w^{12}), p(w^8), p(w^7), p(w^{10}), P(w^{11}), p(w^{13})$ and $p(w^{14})$ may be downloaded. Note that, besides $p(w^3)$, all the other missing blocks may now already be recreated. In third time slot, $p(w^{12})$ may be downloaded to recreate it. Thus, in this example, six out of the seven missing blocks may be recreated within the time taken to download two fragments, while the last block may be recreated in the next time round, subject to the constraints that any node could download or upload only one block in unit time.

Even if a full copy of the object (for example according to a commonly used hybrid strategy) were to be maintained in the system, with which to replenish the seven missing blocks, it would have taken seven time units. While, if no full copy was maintained, using commonly used erasure codes would have taken at least nine time units.

This example demonstrates that SRC according to various embodiments may allow for fast reconstruction of missing blocks.

According to various embodiments, new family of codes, called self-repairing codes, which are designed by taking into account specifically the characteristics of distributed networked storage systems may be provided. Self-repairing codes may achieve excellent properties in terms of maintenance of lost redundancy in the storage system, most importantly: (i) low-bandwidth consumption for repairs (with flexible/somewhat independent choice of whether an eager or lazy repair strategy is employed), (ii) parallel and independent (thus very fast) replenishment of lost redundancy. When compared to commonly used erasure codes, the self-repairing property may be achieved by marginally compromising on static resilience for same storage overhead, or conversely, utilizing marginally more storage space to achieve equivalent static resilience. In the above, theoretical foundations for SRCs have been provided, and its benefits for distributed storage have been shown.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A data encoding method, comprising:
   inputting data to be encoded;
   determining a polynomial so that an evaluation of the polynomial at a sum of a first supporting point of the polynomial and a second supporting point of the polynomial corresponds to the sum of an evaluation of the polynomial at the first supporting point and an evaluation of the polynomial at the second supporting point, wherein coefficients of the polynomial are determined based on the data to be encoded; and
   generating a plurality of encoded data items by evaluating the polynomial at a plurality of supporting points.

2. The data encoding method of claim 1, further comprising:
   dividing the data to be encoded into a plurality of encoding blocks.

3. The data encoding method of claim 2,
   wherein at least one coefficient of the polynomial corresponds to an encoding block of the plurality of encoding blocks.

4. The data encoding method of claim 3,
wherein each coefficient of the polynomial corresponds to an encoding block of the plurality of encoding blocks.

5. The data encoding method of claim 2,
wherein each block of the plurality of blocks is used in one coefficient of the polynomial.

6. The data encoding method of claim 2,
wherein at least one encoding block of the plurality of encoding blocks is an element of a finite field.

7. The data encoding method of claim 6,
wherein each encoding block of the plurality of encoding blocks is an element of the finite field.

8. The data encoding method of claim 1,
wherein the polynomial is a polynomial p of the form $$p(X) = \sum_{i=0}^{k-1} p_i X^{2^i},$$

wherein k is a positive integer, and $p_i$ is an element of a finite field with a number of elements corresponding to a power of 2.

9. A data decoding method, comprising:
inputting a plurality of encoded data items;
determining a polynomial that corresponds to the encoded data items based on a pre-defined similarity criterion so that an evaluation of the polynomial at a sum of a first supporting point of the polynomial and a second supporting point of the polynomial corresponds to the sum of an evaluation of the polynomial at the first supporting point and an evaluation of the polynomial at the second supporting point;
determining coefficients of the polynomial; and
generating decoded data based on the coefficients.

10. The data decoding method of claim 9,
wherein a supporting point is assigned to each of the encoded data items;
wherein the polynomial is determined so that the evaluation of the polynomial at a supporting point assigned to an encoded data item of the plurality of data items corresponds to the encoded data item.

11. A data reconstruction method, comprising:
determining, for an encoded data item that is to be reconstructed, at least two other encoded data items based on a pre-determined polynomial for which an evaluation of the polynomial at a sum of a first supporting point of the polynomial and a second supporting point of the polynomial corresponds to the sum of an evaluation of the polynomial at the first supporting point and an evaluation of the polynomial at the second supporting point; and
reconstructing the encoded data item that is to be reconstructed, based on the determined at least two other encoded data items.

12. The data reconstruction method of claim 11,
wherein a supporting point is assigned to each of the encoded data item that is to be reconstructed and the at least two other encoded data items.

13. The data reconstruction method of claim 11, further comprising:
determining a generator of a multiplicative group.

14. The data reconstruction method of claim 13, further comprising:
for a monomial of a pre-determined degree of the generator, determining a polynomial of the generator with a degree lower than the pre-determined degree of the monomial, so that the polynomial corresponds to the monomial.

15. The data reconstruction method of claim 14,
wherein the at least two other encoded data items are determined based on the determining of the polynomial of the generator.

16. A data encoding device, comprising:
an input circuit configured to input data to be encoded;
a polynomial determining circuit configured to determine a polynomial so that an evaluation of the polynomial at a sum of a first supporting point of the polynomial and a second supporting point of the polynomial corresponds to the sum of an evaluation of the polynomial at the first supporting point and an evaluation of the polynomial at the second supporting point, wherein the coefficients of the polynomial are determined based on the data to be encoded; and
a generating circuit configured to generate a plurality of encoded data items by evaluating the polynomial at a plurality of supporting points.

17. The data encoding device of claim 16, further comprising:
a dividing circuit configured to divide the data to be encoded into a plurality of encoding blocks.

18. The data encoding device of claim 17,
wherein at least one coefficient of the polynomial corresponds to an encoding block of the plurality of encoding blocks.

19. The data encoding device of claim 18,
wherein each coefficient of the polynomial corresponds to an encoding block of the plurality of encoding blocks.

20. The data encoding device of claim 17,
wherein each block of the plurality of blocks is used in one coefficient of the polynomial.

21. The data encoding device of claim 17,
wherein at least one encoding block of the plurality of encoding blocks is an element of a finite field.

22. The data encoding device of claim 21,
wherein each encoding block of the plurality of encoding blocks is an element of the finite field.

23. The data encoding device of claim 16,
wherein the polynomial is a polynomial p of the form $$p(X) = \sum_{i=0}^{k-1} p_i X^{2^i},$$

wherein k is a positive integer, and $p_i$ is an element of a finite field with a number of elements corresponding to a power of 2.

24. A data decoding device, comprising:
an input circuit configured to input a plurality of encoded data items;
a polynomial determining circuit configured to determine a polynomial that corresponds to the encoded data items based on a pre-defined similarity criterion so that an evaluation of the polynomial at a sum of a first supporting point of the polynomial and a second supporting point of the polynomial corresponds to the sum of an evaluation of the polynomial at the first supporting point and an evaluation of the polynomial at the second supporting point;
a coefficients determining circuit configured to determine coefficients of the polynomial; and a decoded data generating circuit configured to generate decoded data based on the coefficients.

25. The data decoding device of claim 24,
wherein a supporting point is assigned to each of the encoded data items;
wherein the polynomial determining circuit is further configured to determine the polynomial so that the evaluation of the polynomial at a supporting point assigned to an encoded data item of the plurality of data items corresponds to the encoded data item.

26. A data reconstruction device, comprising:
an encoded data determining circuit configured to determine, for an encoded data item that is to be reconstructed, at least two other encoded data items based on a pre-determined polynomial for which an evaluation of the polynomial at a sum of a first supporting point of the polynomial and a second supporting point of the polynomial corresponds to the sum of an evaluation of the polynomial at the first supporting point and an evaluation of the polynomial at the second supporting point; and
a reconstructing circuit configured to reconstruct the encoded data item that is to be reconstructed, based on the determined at least two other encoded data items.

27. The data reconstruction device of claim 26,
wherein a supporting point is assigned to each of the encoded data item that is to be reconstructed and the at least two other encoded data items.

28. The data reconstruction device of claim 26, further comprising:
a generator determining circuit configured to determine a generator of a multiplicative group.

29. The data reconstruction device of claim 28, further comprising:
a generator polynomial determining circuit configured to, for a monomial of a pre-determined degree of the generator, determine a polynomial of the generator with a degree lower than the pre-determined degree of the monomial, so that the polynomial corresponds to the monomial.

30. The data reconstruction device of claim 29,
wherein the encoded data determining circuit is further configured to determine the at least two other encoded data items based on the determining of the polynomial of the generator.

* * * * *